United States Patent [19]
Estakhri et al.

[11] Patent Number: 5,930,815
[45] Date of Patent: Jul. 27, 1999

[54] MOVING SEQUENTIAL SECTORS WITHIN A BLOCK OF INFORMATION IN A FLASH MEMORY MASS STORAGE ARCHITECTURE

[75] Inventors: Petro Estakhri, Pleasanton; Berhanu Iman, Sunnyvale, both of Calif.

[73] Assignee: Lexar Media, Inc., Fremont, Calif.

[21] Appl. No.: 08/946,331

[22] Filed: Oct. 7, 1997

Related U.S. Application Data

[63] Continuation-in-part of application No. 08/831,266, Mar. 31, 1997, which is a continuation-in-part of application No. 08/509,706, Jul. 31, 1995.

[51] Int. Cl.[6] ............................. G06F 12/02; G06F 12/10
[52] U.S. Cl. ........................... 711/103; 711/156; 711/165; 711/206
[58] Field of Search ................................... 711/103, 156, 711/165, 206

[56] References Cited

U.S. PATENT DOCUMENTS

| | | | |
|---|---|---|---|
| 4,405,952 | 9/1983 | Slakmon | 360/49 |
| 4,450,559 | 5/1984 | Bond et al. | 395/182.04 |
| 4,456,971 | 6/1984 | Fukuda et al. | 395/500 |
| 4,498,146 | 2/1985 | Martinez | 711/115 |
| 4,525,839 | 7/1985 | Nozawa et al. | 371/10.2 |
| 4,616,311 | 10/1986 | Sato | 711/206 |
| 4,654,847 | 3/1987 | Dutton | 395/182.04 |
| 4,710,871 | 12/1987 | Belknap et al. | 395/200.67 |

(List continued on next page.)

FOREIGN PATENT DOCUMENTS

| | | |
|---|---|---|
| 0 557 723 | 1/1987 | Australia . |
| 0 220 718 A2 | 5/1987 | European Pat. Off. . |
| 0 243 503 A1 | 11/1987 | European Pat. Off. . |
| 0 424 191 A2 | 4/1991 | European Pat. Off. . |
| 0 489 204 A1 | 6/1992 | European Pat. Off. . |
| 0 522 780 A2 | 1/1993 | European Pat. Off. . |
| 0 544 252 A2 | 6/1993 | European Pat. Off. . |
| 0 686 976 A2 | 12/1995 | European Pat. Off. . |

(List continued on next page.)

OTHER PUBLICATIONS

ISBN 0–07–031556–6 Book —*Computer Architecture and Parallel Processing*, Kai Hwang & Faye A. Briggs, McGraw–Hill Book Co., © 1984, p. 64.

1990 WL 2208325 Magazine—"State of the Art: Magnetic VS. Optical Store Data in a Flash", by Walter Lahti and Dean McCarron, Byte magazine dated Nov. 1, 1990, 311, vol. 15, No. 12.

G11C16/06 P4A1 Magazine—Technology Updates, Integrated Circuits, "1–Mbit flash memories seek their role in system design", Ron Wilson, Senior Editor, Computer Design magazine 28 (1989) Mar. 1, No. 5, Tulsa OK, US, pp. 30 and 32..

Serial 9Mb F 1992 Symposium of VLSI Circuits Digest of Technical Papers, "EEPROM for Solid State Disk Applications", S. Mehoura et al., SunDisk Corporation, Santa Clara, CA. R. W. Gregor et al., AT&T Bell Laboratories, Allentown, PA. pp. 24 and 25.

*Primary Examiner*—Eddie P. Chan
*Assistant Examiner*—Reginald G. Bragdon
*Attorney, Agent, or Firm*—Maryam Imam

[57] ABSTRACT

A method and apparatus is disclosed for increasing the system performance of a digital system having a controller for controlling nonvolatile devices for storing blocks of information, each block having a group of sectors. When sectors within a block are being re-written in sequential order, the controller writes the new sector information into a sector location of another block without the need to move any of the sectors within the original block thereby reducing the number of read and write cycles needed to avoid erase-before-write operations. A 'used' flag, stored in the sector location of each block, indicates that the sector has been transferred to another block or, alternatively, a move locator word maintains status information regarding the position of the sectors within the block that have been moved.

14 Claims, 34 Drawing Sheets

U.S. PATENT DOCUMENTS

| | | | |
|---|---|---|---|
| 4,746,998 | 5/1988 | Robinson et al. | 360/72.1 |
| 4,748,320 | 5/1988 | Yorimoto et al. | 235/492 |
| 4,757,474 | 7/1988 | Fukushi et al. | 365/189.07 |
| 4,774,700 | 9/1988 | Satoh et al. | 369/54 |
| 4,800,520 | 1/1989 | Iijima | 707/206 |
| 4,896,262 | 1/1990 | Wayama et al. | 395/500 |
| 4,914,529 | 4/1990 | Bonke | 360/48 |
| 4,920,518 | 4/1990 | Nakamura et al. | 365/228 |
| 4,924,331 | 5/1990 | Robinson et al. | 360/72.1 |
| 4,953,122 | 8/1990 | Williams | 711/4 |
| 5,070,474 | 12/1991 | Tuma et al. | 395/500 |
| 5,226,168 | 7/1993 | Kobayashi et al. | 395/800 |
| 5,270,979 | 12/1993 | Harari et al. | 365/185.09 |
| 5,297,148 | 3/1994 | Harari et al. | 371/10.2 |
| 5,303,198 | 4/1994 | Adachi et al. | 365/185.11 |
| 5,337,275 | 8/1994 | Garner | 365/189.01 |
| 5,341,330 | 8/1994 | Wells et al. | 365/185.33 |
| 5,341,339 | 8/1994 | Wells | 364/185.11 |
| 5,353,256 | 10/1994 | Fandrich et al. | 365/185.11 |
| 5,357,475 | 10/1994 | Hasbun et al. | 711/103 |
| 5,388,083 | 2/1995 | Assar et al. | 365/185.33 |
| 5,430,859 | 7/1995 | Norman et al. | 711/103 |
| 5,479,638 | 12/1995 | Assar et al. | 711/103 |
| 5,485,595 | 1/1996 | Assar et al. | 711/104 |
| 5,524,230 | 6/1996 | Sakaue et al. | 711/103 |
| 5,544,356 | 8/1996 | Robinson et al. | 707/205 |
| 5,566,314 | 10/1996 | DeMarco et al. | 711/103 |
| 5,586,285 | 12/1996 | Hasbun et al. | 711/103 |

FOREIGN PATENT DOCUMENTS

| | | |
|---|---|---|
| 93 01908 | 8/1993 | France . |
| 59-45695 | 9/1982 | Japan . |
| 58-215794 | 12/1983 | Japan . |
| 58-215795 | 12/1983 | Japan . |
| 59-162695 | 9/1984 | Japan . |
| 60-212900 | of 1985 | Japan . |
| 61-96598 | 5/1986 | Japan . |
| 62-283496 | 12/1987 | Japan . |
| 62-283497 | 12/1987 | Japan . |
| 63-183700 | 7/1988 | Japan . |
| 4-332999 | 11/1992 | Japan . |
| 84/00628 | 2/1984 | WIPO . |

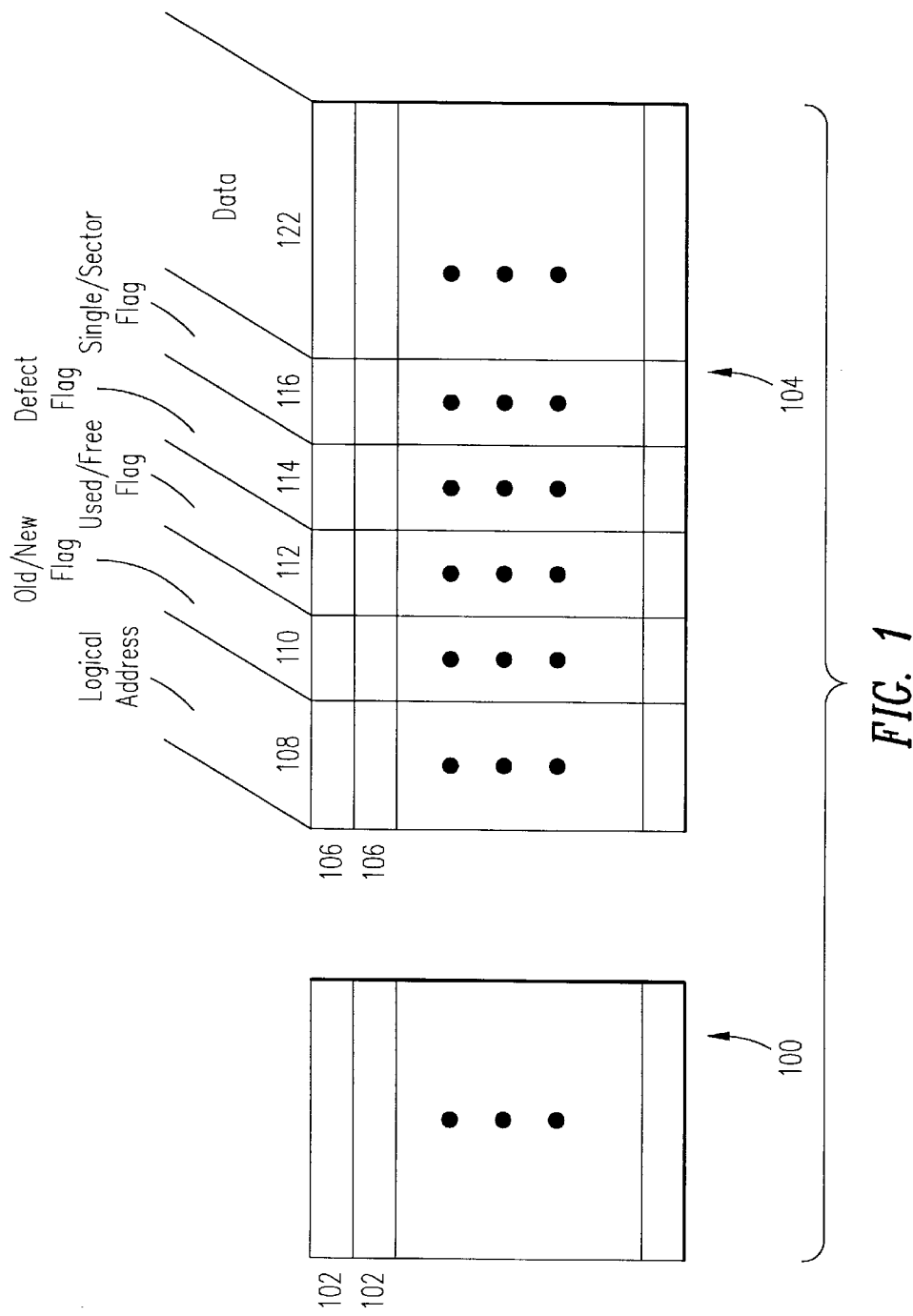

| Actual LBA/ Actual PBA | Virtual PBA | old | used | def |
|---|---|---|---|---|
| 0 | | 0 | 0 | 0 |
| 1 | | 0 | 0 | 0 |
| 2 | | 0 | 0 | 0 |
| 3 | | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 4*

| Actual LBA/ Actual PBA | Virtual PBA | old | used | def |
|---|---|---|---|---|
| 0 | | 0 | 1 | 0 |
| 1 | | 0 | 0 | 0 |
| 2 | | 0 | 0 | 0 |
| 3 | 0 | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 5*

| Actual LBA/ Actual PBA | Virtual PBA | old | used | def |
|---|---|---|---|---|
| 0 | | 0 | 1 | 0 |
| 1 | | 0 | 1 | 0 |
| 2 | | 0 | 0 | 0 |
| 3 | 0 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 6*

| Actual LBA/ Actual PBA | Virtual PBA | old | used | def |
|---|---|---|---|---|
| 0 | | 1 | 1 | 0 |
| 1 | | 0 | 1 | 0 |
| 2 | | 0 | 1 | 0 |
| 3 | 2 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 7*

| Actual LBA/ Actual PBA | Virtual PBA | old | used | def |
|---|---|---|---|---|
| 0 | | 1 | 1 | 0 |
| 1 | | 1 | 1 | 0 |
| 2 | | 0 | 1 | 0 |
| 3 | 2 | 0 | 1 | 0 |
| 4 | 3 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 8*

| PBA/LBA | VPBA Blk Addr 702 730 | MVPBA Blk Addr 704 | Move Flag 706 732 | Used Flag 708 734 | Old Flag 710 736 | Defect Flag 712 738 740 | L 0 | L 1 | L 2 | L 3 | L 4 | L 5 | L 6 | L 7 | L 8 | L 9 | L 10 | L 11 | L 12 | L 13 | L 14 | L 15 |
|---|---|---|---|---|---|---|---|---|---|---|---|---|---|---|---|---|---|---|---|---|---|---|
| 00  716 | 00 | XX | 0 | 1 | 0 | 0 | 0 | 0 | 0 | 0 | 0 | 0 | 0 | 0 | 0 | 0 | 0 | 0 | 0 | 0 | 0 | 0 |
| 10  718 | XX | XX | 0 | 0 | 0 | 0 | 0 | 0 | 0 | 0 | 0 | 0 | 0 | 0 | 0 | 0 | 0 | 0 | 0 | 0 | 0 | 0 |
| 20  720 | | | | | | | | | | | | | | | | | | | | | | |
| 30  722 | | | | | | | | | | | | | | | | | | | | | | |
| 40  724 | | | | | | | | | | | | | | | | | | | | | | |
| 50  726 | | | | | | | | | | | | | | | | | | | | | | |
| ⋮ | ⋮ | ⋮ | ⋮ | ⋮ | ⋮ | ⋮ | | | | | | | | | | | | | | | | |
| N-1  728 | | | | | | | | | | | | | | | | | | | | | | |

WRITE to LBA 0 AGAIN

| PBA/LBA | VPBA Blk Addr | MVPBA Blk Addr | Move Flag | Used Flag | Old Flag | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 | 00 | 10 | 1 | 1 | 0 | 0 | 1 | 0 | 0 | 0 | 0 | 0 | 0 | 0 | 0 | 0 | 0 | 0 | 0 | 0 | 0 | 0 |
| 10 | XX | XX | 0 | 1 | 0 | 0 | 0 | 0 | 0 | 0 | 0 | 0 | 0 | 0 | 0 | 0 | 0 | 0 | 0 | 0 | 0 | 0 |
| 20 | | | | | | | | | | | | | | | | | | | | | | |
| 30 | | | | | | | | | | | | | | | | | | | | | | |
| 40 | | | | ... | ... | ... | | | | | | | | | | | | | | | | |
| 50 | | | | | | | | | | | | | | | | | | | | | | |
| ... | | | | | | | | | | | | | | | | | | | | | | |
| N-1 | | | | | | | | | | | | | | | | | | | | | | |

Host Write To LBA 0

| PBA/LBA | VPBA Blk Addr (702/730) | MVPBA Blk Addr (704/732) | Move Flag (706/734) | Used Flag (708/736) | Old Flag (710/738) | Defect Flag (712/740) | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 (716) | 00 | XX | 0 | 1 | 0 | 0 | 0 | 0 | 0 | 0 | 0 | 0 | 0 | 0 | 0 | 0 | 0 | 0 | 0 | 0 | 0 | 0 |
| 10 (718) | XX | XX | 0 | 0 | 0 | 0 | 0 | 0 | 0 | 0 | 0 | 0 | 0 | 0 | 0 | 0 | 0 | 0 | 0 | 0 | 0 | 0 |
| 20 (720) | | | | | | | | | | | | | | | | | | | | | | |
| 30 (722) | | | | | | | | | | | | | | | | | | | | | | |
| 40 (724) | | | | | | | | | | | | | | | | | | | | | | |
| 50 (726) | | | | | | | | | | | | | | | | | | | | | | |
| ... | . | . | . | . | . | . | | | | | | | | | | | | | | | | |
| N−1 (728) | | | | | | | | | | | | | | | | | | | | | | |

714 (L0–L15 group), 700

Write To LBA 0 Again

| PBA/LBA | VPBA Blk Addr (702/730) | MVPBA Blk Addr (732) | Move Flag (706/734) | Used Flag (708/736) | Old Flag (738/742) | Defect Flag (740) | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 (716) | 00 | 10 | 1 | 1 | 0 | 0 | 1 | 0 | 0 | 0 | 0 | 0 | 0 | 0 | 0 | 0 | 0 | 0 | 0 | 0 | 0 | 0 |
| 10 (718) | XX | XX | 0 | 1 | 0 | 0 | 0 | 0 | 0 | 0 | 0 | 0 | 0 | 0 | 0 | 0 | 0 | 0 | 0 | 0 | 0 | 0 |
| 20 (720) | | | | | | | | | | | | | | | | | | | | | | |
| 30 (722) | . | . | . | . | . | . | | | | | | | | | | | | | | | | |
| 40 (724) | | | | | | | | | | | | | | | | | | | | | | |
| 50 (726) | | | | | | | | | | | | | | | | | | | | | | |
| N-1 (728) | | | | | | | | | | | | | | | | | | | | | | |

Host Write To LBA 0

| PBA/LBA | VPBA Blk Addr (702) | MVPBA Blk Addr (732) | Move Flag (734) | Used Flag (742) | Old Flag (744) | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 | 00 | 20 | 1 | 1 | 0 | 0 | 1 | 0 | 0 | 0 | 0 | 0 | 0 | 0 | 0 | 0 | 0 | 0 | 0 | 0 | 0 | 0 |
| 10 | XX | XX | 0 | 1 | 1 | 0 | 0 | 0 | 0 | 0 | 0 | 0 | 0 | 0 | 0 | 0 | 0 | 0 | 0 | 0 | 0 | 0 |
| 20 | XX | XX | 0 | 1 | 0 | 0 | 0 | 0 | 0 | 0 | 0 | 1 | 0 | 0 | 0 | 0 | 0 | 0 | 0 | 0 | 0 | 0 |
| 30 | | | | | | | | | | | | | | | | | | | | | | |
| 40 | | | | | | | | | | | | | | | | | | | | | | |
| 50 | | | | | | | | | | | | | | | | | | | | | | |
| ... | ... | ... | ... | ... | ... | ... | | | | | | | | | | | | | | | | |
| N-1 | | | | | | | | | | | | | | | | | | | | | | |

Host Writes To LBA 7

| PBA/LBA | VPBA Blk Addr | MVPBA Blk Addr | Move Flag | Used Flag | Old Flag | Defect Flag | L0 | L1 | L2 | L3 | L4 | L5 | L6 | L7 | L8 | L9 | L10 | L11 | L12 | L13 | L14 | L15 |
|---|---|---|---|---|---|---|---|---|---|---|---|---|---|---|---|---|---|---|---|---|---|---|
| 00 | 00 | 10 | 1 | 1 | 0 | 0 | 1 | 0 | 0 | 0 | 0 | 1 | 0 | 1 | 0 | 0 | 0 | 0 | 0 | 0 | 0 | 0 |
| 10 | XX | XX | 0 | 1 | 0 | 0 | 0 | 0 | 0 | 0 | 0 | 0 | 0 | 0 | 0 | 0 | 0 | 0 | 0 | 0 | 0 | 0 |
| 20 | | | | | | | | | | | | | | | | | | | | | | |
| 30 | | | | | | | | | | | | | | | | | | | | | | |
| 40 | ... | ... | ... | ... | ... | ... | | | | | | | | | | | | | | | | |
| 50 | | | | | | | | | | | | | | | | | | | | | | |
| N-1 | | | | | | | | | | | | | | | | | | | | | | |

Key To

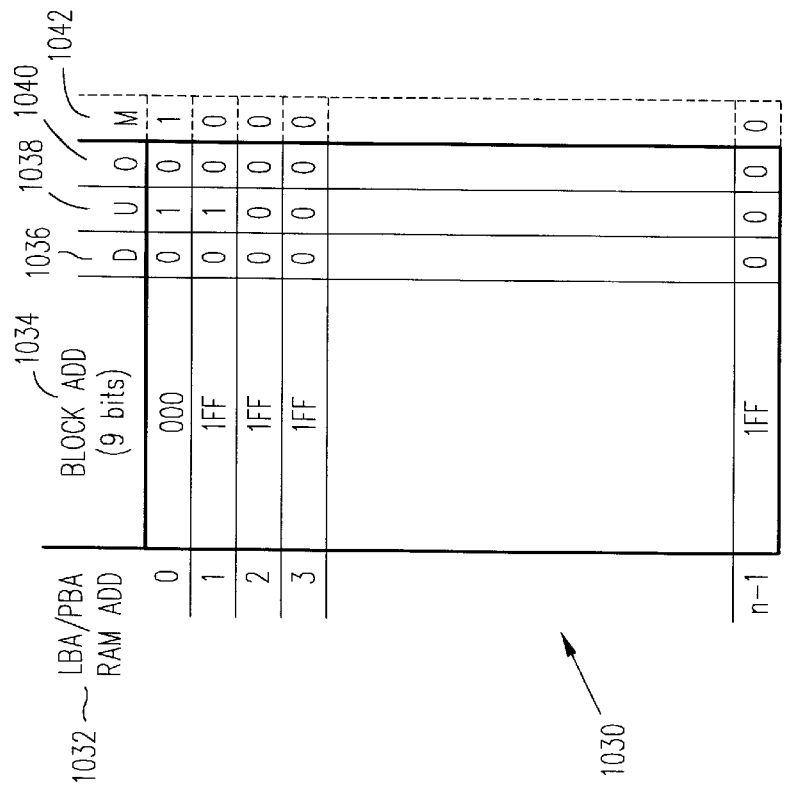
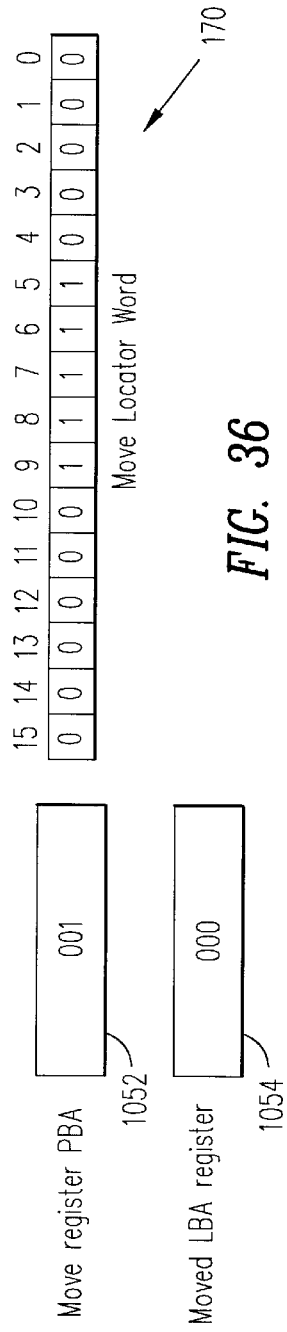
FIG. 36

MOVING SEQUENTIAL SECTORS WITHIN A BLOCK OF INFORMATION IN A FLASH MEMORY MASS STORAGE ARCHITECTURE

CROSS REFERENCE TO RELATED APPLICATION

This application is a continuation-in-part of a prior U.S. application with Ser. No. 08/831,266, filed Mar. 31, 1997 and entitled "MOVING SECTORS WITHIN A BLOCK OF INFORMATION IN A FLASH MEMORY MASS STORAGE ARCHITECTURE", which is a continuation-in-part of another prior U.S. application with Ser. No. 08/509,706, filed Jul. 31, 1995 and entitled "DIRECT LOGICAL BLOCK ADDRESSING FLASH MEMORY MASS STORAGE ARCHITECTURE".

BACKGROUND OF THE INVENTION

1. Field of the Invention

This invention relates to the field of mass storage for computers. More particularly, this invention relates to an architecture for replacing a hard disk with a semiconductor nonvolatile memory and in particular flash memory.

2. Description of the Prior Art

Computers conventionally use rotating magnetic media for mass storage of documents, data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. In particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be nonvolatile and alterable. The inventors have determined that FLASH memory is preferred for such a replacement.

FLASH memory is a transistor memory cell which is programmable through hot electron, source injection, or tunneling, and erasable through Fowler-Nordheim tunneling. The programming and erasing of such a memory cell requires current to pass through the dielectric surrounding floating gate electrode. Because of this, such types of memory have a finite number of erase-write cycles. Eventually, the dielectric deteriorates. Manufacturers of FLASH cell devices specify the limit for the number of erase-write cycles between 100,000 and 1,000,000.

One requirement for a semiconductor mass storage device to be successful is that its use in lieu of a rotating media hard disk mass storage device be transparent to the designer and the user of a system using such a device. In other words, the designer or user of a computer incorporating such a semiconductor mass storage device could simply remove the hard disk and replace it with a semiconductor mass storage device. All presently available commercial software should operate on a system employing such a semiconductor mass storage device without the necessity of any modification.

SanDisk proposed an architecture for a semiconductor mass storage using FLASH memory at the Silicon Valley PC Design Conference on Jul. 9, 1991. That mass storage system included read-write block sizes of 512 Bytes to conform with commercial hard disk sector sizes.

Earlier designs incorporated erase-before-write architectures. In this process, in order to update a file on the media, if the physical location on the media was previously programmed, it has to be erased before the new data can be reprogrammed.

This process would have a major deterioration on overall system throughput. When a host writes a new data file to the storage media, it provides a logical block address to the peripheral storage device associated with this data file. The storage device then translates this given logical block address to an actual physical block address on the media and performs the write operation. In magnetic hard disk drives, the new data can be written over the previous old data with no modification to the media. Therefore, once the physical block address is calculated from the given logical block address by the controller, it will simply write the data file into that location. In solid state storage, if the location associated with the calculated physical block address was previously programmed, before this block can be reprogrammed with the new data, it has to be erased. In one previous art, in erase-before-write architecture where the correlation between logical block address given by the host is one to one mapping with physical block address on the media. This method has many deficiencies. First, it introduces a delay in performance due to the erase operation before reprogramming the altered information. In solid state flash, erase is a very slow process.

Secondly, hard disk users typically store two types of information, one is rarely modified and another which is frequently changed. For example, a commercial spread sheet or word processing software program stored on a user's system are rarely, if ever, changed. However, the spread sheet data files or word processing documents are frequently changed. Thus, different sectors of a hard disk typically have dramatically different usage in terms of the number of times the information stored thereon is changed. While this disparity has no impact on a hard disk because of its insensitivity to data changes, in a FLASH memory device, this variance can cause sections of the mass storage to wear out and be unusable significantly sooner than other sections of the mass storage.

In another architecture, the inventors previously proposed a solution to store a table correlating the logical block address to the physical block address. The inventions relating to that solution are disclosed in U.S. patent application Ser. No. 08/038,668 filed on Mar. 26, 1993 now U.S. Pat. No. 5,388,083, and U.S. patent application Ser. No. 08/037,893 also filed on Mar. 26, 1993 now U.S. Pat. No. 5,479,638. Those applications are incorporated herein by reference.

The inventors' previous solution discloses two primary algorithms and an associated hardware architecture for a semiconductor mass storage device. It will be understood that "data file" in this patent document refers to any computer file including commercial software, a user program, word processing software document, spread sheet file and the like. The first algorithm in the previous solution provides means for avoiding an erase operation when writing a modified data file back onto the mass storage device. Instead, no erase is performed and the modified data file is written onto an empty portion of the mass storage.

The semiconductor mass storage architecture has blocks sized to conform with commercial hard disk sector sizes. The blocks are individually erasable. In one embodiment, the semiconductor mass storage can be substituted for a rotating hard disk with no impact to the user, so that such a substitution will be transparent. Means are provided for avoiding the erase-before-write cycle each time information stored in the mass storage is changed.

According to the first algorithm, erase cycles are avoided by programming an altered data file into an empty block. This would ordinarily not be possible when using conventional mass storage because the central processor and commercial software available in conventional computer systems are not configured to track continually changing physical locations of data files. The previous solution includes a programmable map to maintain a correlation between the logical address and the physical address of the updated information files.

All the flags, and the table correlating the logical block address to the physical block address are maintained within an array of CAM cells. The use of the CAM cells provides very rapid determination of the physical address desired within the mass storage, generally within one or two clock cycles. Unfortunately, as is well known, CAM cells require multiple transistors, typically six. Accordingly, an integrated circuit built for a particular size memory using CAM storage for the tables and flags will need to be significantly larger than a circuit using other means for just storing the memory.

The inventors proposed another solution to this problem which is disclosed in U.S. patent application Ser. No. 08/131,495 filed on Oct. 4, 1993 now U.S. Pat. No. 5,485,595. That application is incorporated herein by reference.

This additional previous solution invented by these same inventors is also for a nonvolatile memory storage device. The device is also configured to avoid having to perform an erase-before-write each time a data file is changed by keeping a correlation between logical block address and physical block address in a volatile space management RAM. Further, this invention avoids the overhead associated with CAM cell approaches which require additional circuitry.

Like the solutions disclosed above by these same inventors, the device includes circuitry for performing the two primary algorithms and an associated hardware architecture for a semiconductor mass storage device. In addition, the CAM cell is avoided in this previous solution by using RAM cells.

Reading is performed in this previous solutions by providing the logical block address to the memory storage. The system sequentially compares the stored logical block addresses until it finds a match. That data file is then coupled to the digital system. Accordingly, the performance offered by this solution suffers because potentially all of the memory locations must be searched and compared to the desired logical block address before the physical location of the desired information can be determined.

What is needed is a semiconductor hard disk architecture which provides rapid access to stored data without the excessive overhead of CAM cell storage.

SUMMARY OF THE INVENTION

The present invention is for a nonvolatile memory storage device. The device is configured to avoid having to perform an erase-before-write each time a data file is changed. Further, to avoid the overhead associated with CAM cells, this approach utilizes a RAM array. The host system maintains organization of the mass storage data by using a logical block address. The RAM array is arranged to be addressable by the same address as the logical block addresses (LBA) of the host. Each such addressable location in the RAM includes a field which holds the physical address of the data in the nonvolatile mass storage expected by the host. This physical block address (PBA) information must be shadowed in the nonvolatile memory to ensure that the device will still function after resuming operation after a power down because RAMs are volatile memory devices. In addition, status flags are also stored for each physical location. The status flags can be stored in either the nonvolatile media or in both the RAM and in the nonvolatile media.

The device includes circuitry for performing two primary algorithms and an associated hardware architecture for a semiconductor mass storage device. The first algorithm provides a means for mapping of host logical block address to physical block address with much improved performance and minimal hardware assists. In addition, the second algorithm provides means for avoiding an erase-before-write cycle when writing a modified data file back onto the mass storage device. Instead, no erase is performed and the modified data file is written onto an empty portion of the mass storage.

Reading is performed in the present invention by providing the logical block address to the memory storage. The RAM array is arranged so that the logical block address selects one RAM location. That location contains the physical block address of the data requested by the host or other external system. That data file is then read out to the host.

According to the second algorithm, erase cycles are avoided by programming an altered data file into an altered data mass storage block rather than itself after an erase cycle of the block as done on previous arts.

In an alternative embodiment of the present invention, a method and apparatus is presented for efficiently moving sectors within a block from a first area within the nonvolatile memory to an unused area within the nonvolatile memory and marking the first area as "used".

Briefly, A preferred embodiment of the present invention includes a method and apparatus for storing mapping information for mapping a logical block address identifying a block being accessed by a host to a physical block address, identifying a free area of nonvolatile memory, the block being selectively erasable and having one or more sectors that may be individually moved. The mapping information including a virtual physical block address for identifying an "original" location, within the nonvolatile memory, wherein a block is stored and a moved virtual physical block address for identifying a "moved" location, within the nonvolatile memory, wherein one or more sectors of the stored block are moved. The mapping information further including status information for use of the "original" physical block address and the "moved" physical block address and for providing information regarding "moved" sectors within the block being accessed.

IN THE DRAWINGS

FIG. 1 shows a schematic block diagram of an architecture for a semiconductor mass storage according to the present invention.

FIG. 2 shows an alternative embodiment to the physical block address 102 of the RAM storage of FIG. 1.

FIGS. 4–8 show the status of several of the flags and information for achieving the advantages of the present invention.

FIGS. 11–21 illustrate several examples of the state of a mapping table that may be stored in the digital system of FIG. 10 including LBA-PBA mapping information.

Figure 24A:
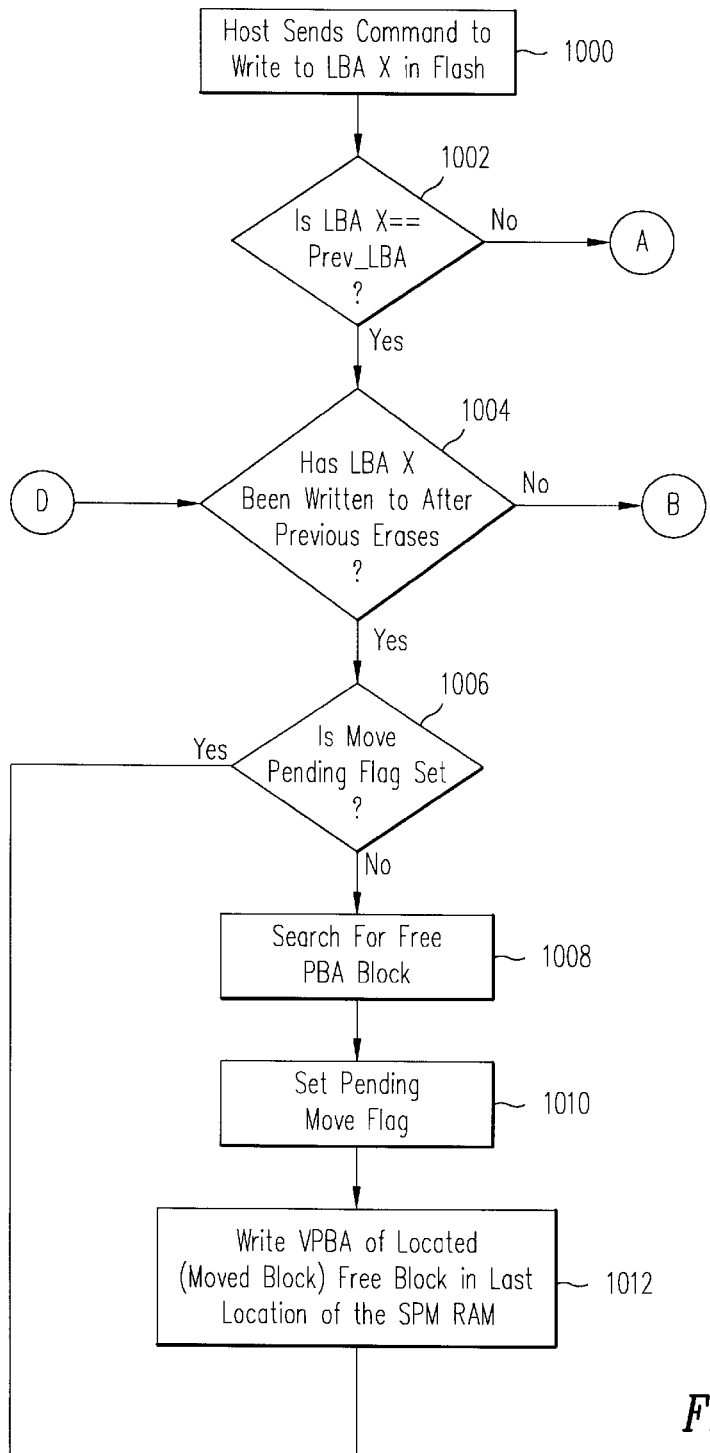
Figures 24, 24B:
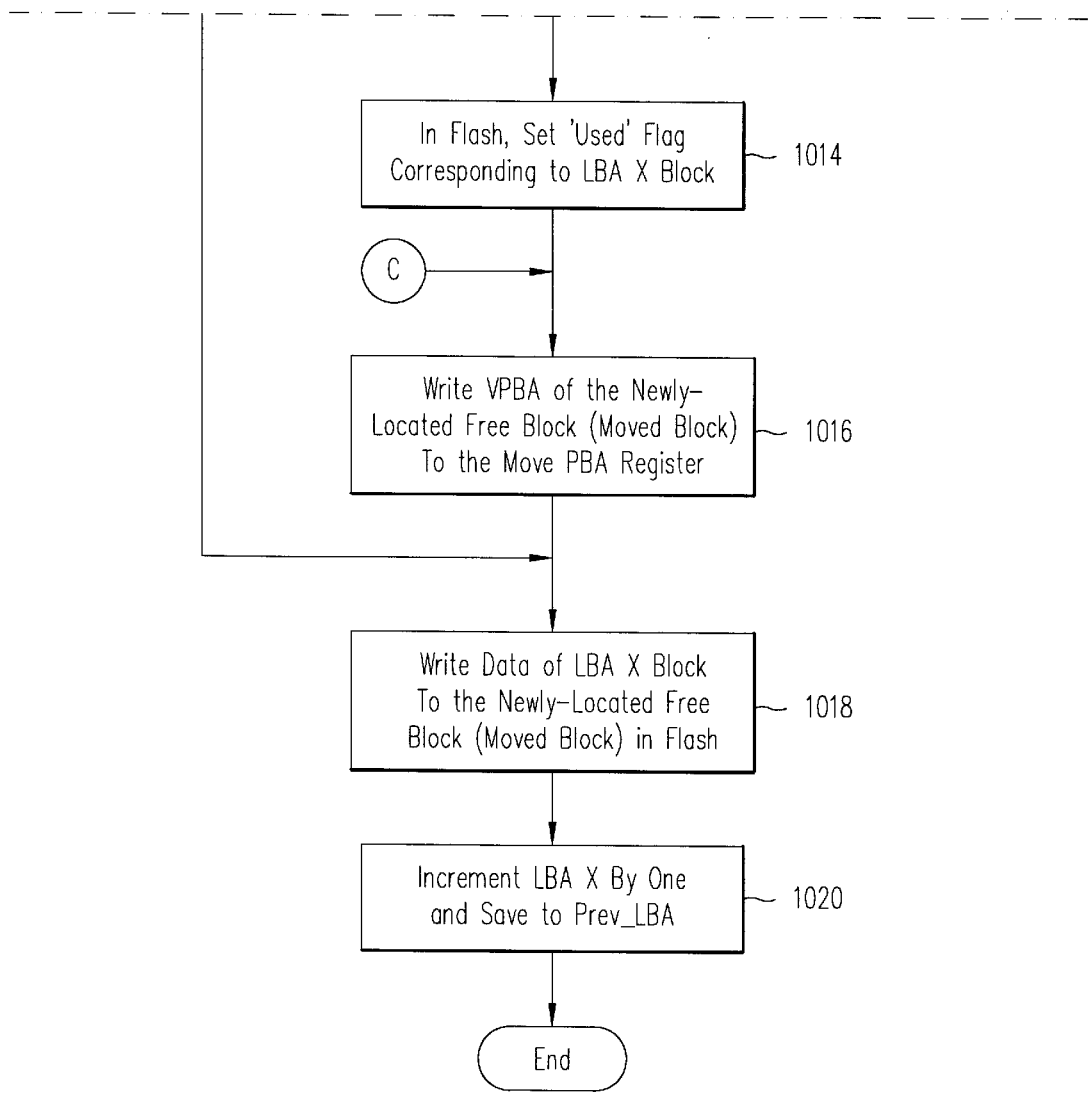
Figure 25:
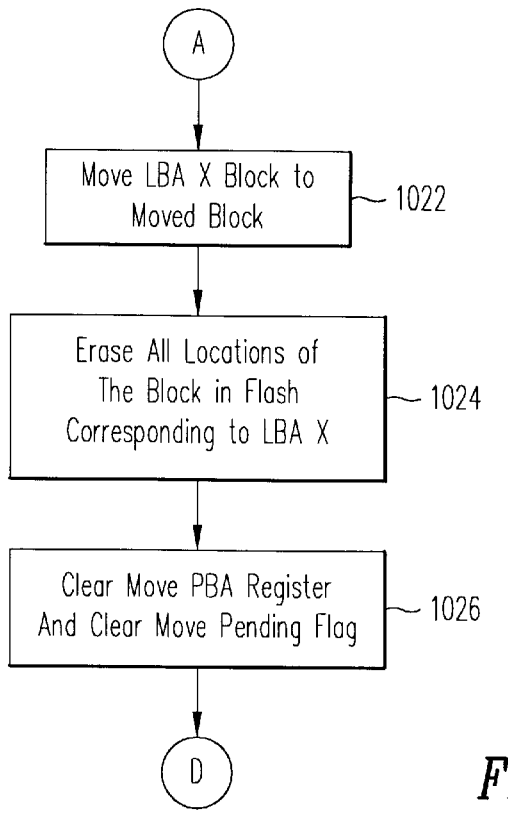
Figure 26:
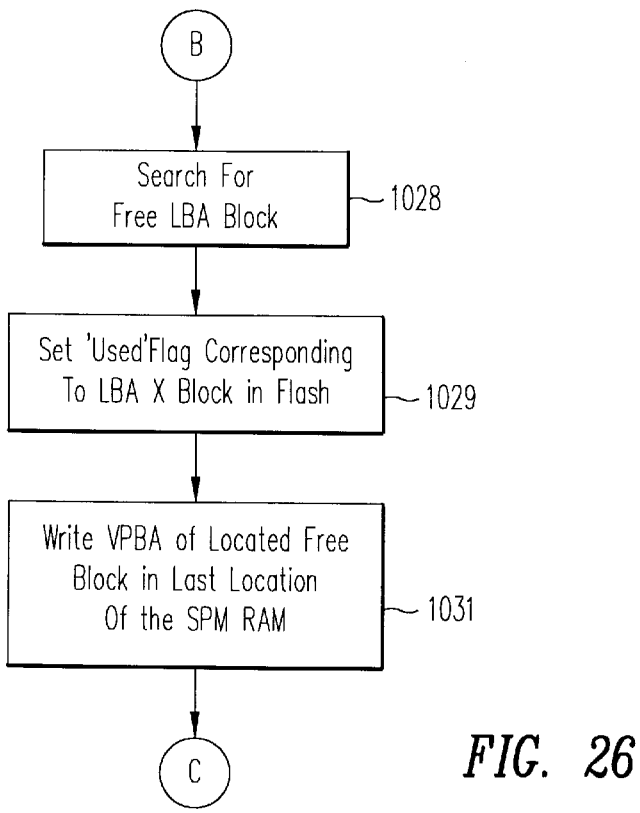

FIGS. 24–26 generally show, in flow chart form, the operation of another preferred embodiment of the present invention employing single sequential sector move operations.

Figure 27:
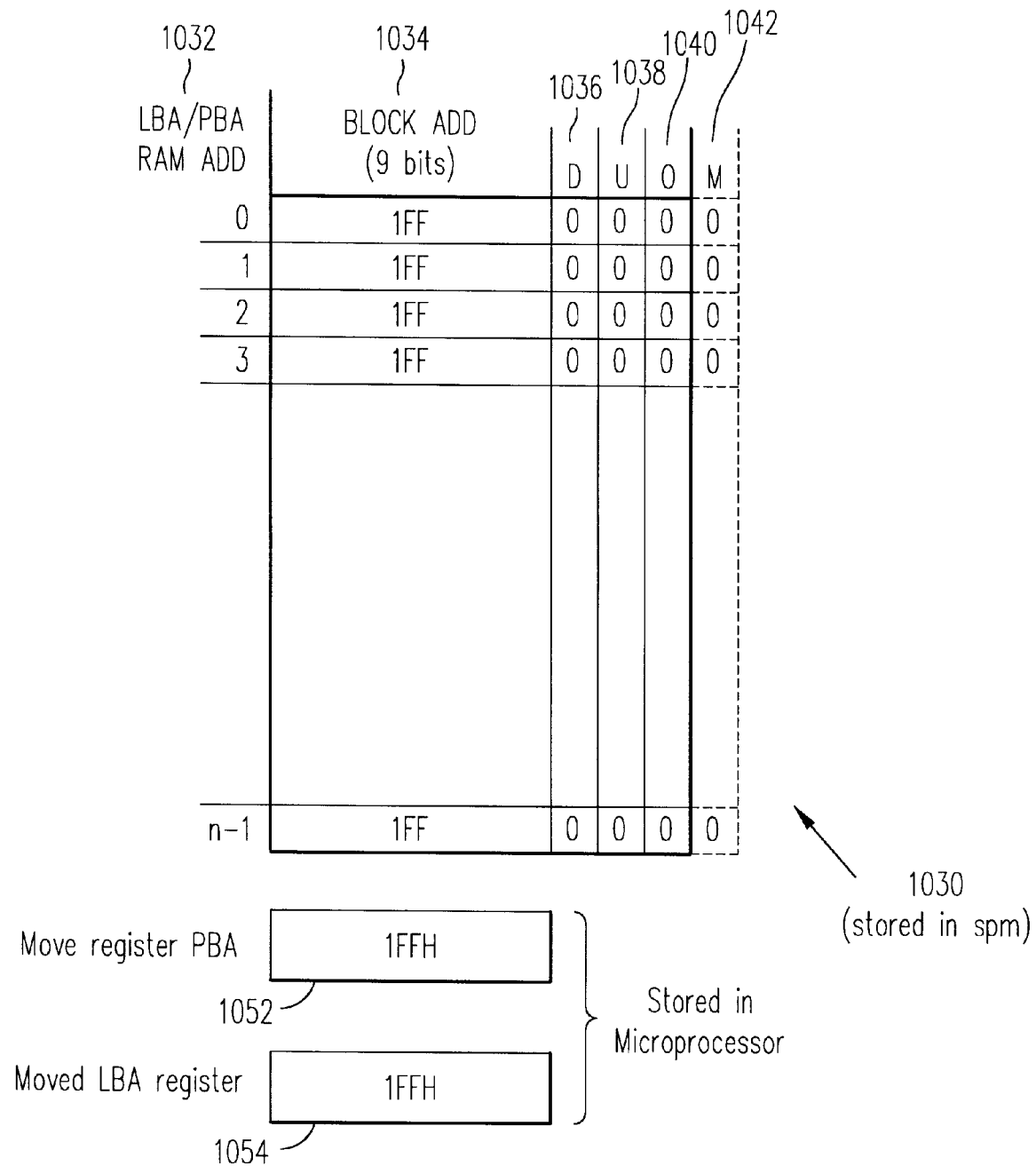

FIGS. 27 shows an example after initialization of the system of the contents of the lookup table in SPM RAM 548.

Figure 28:
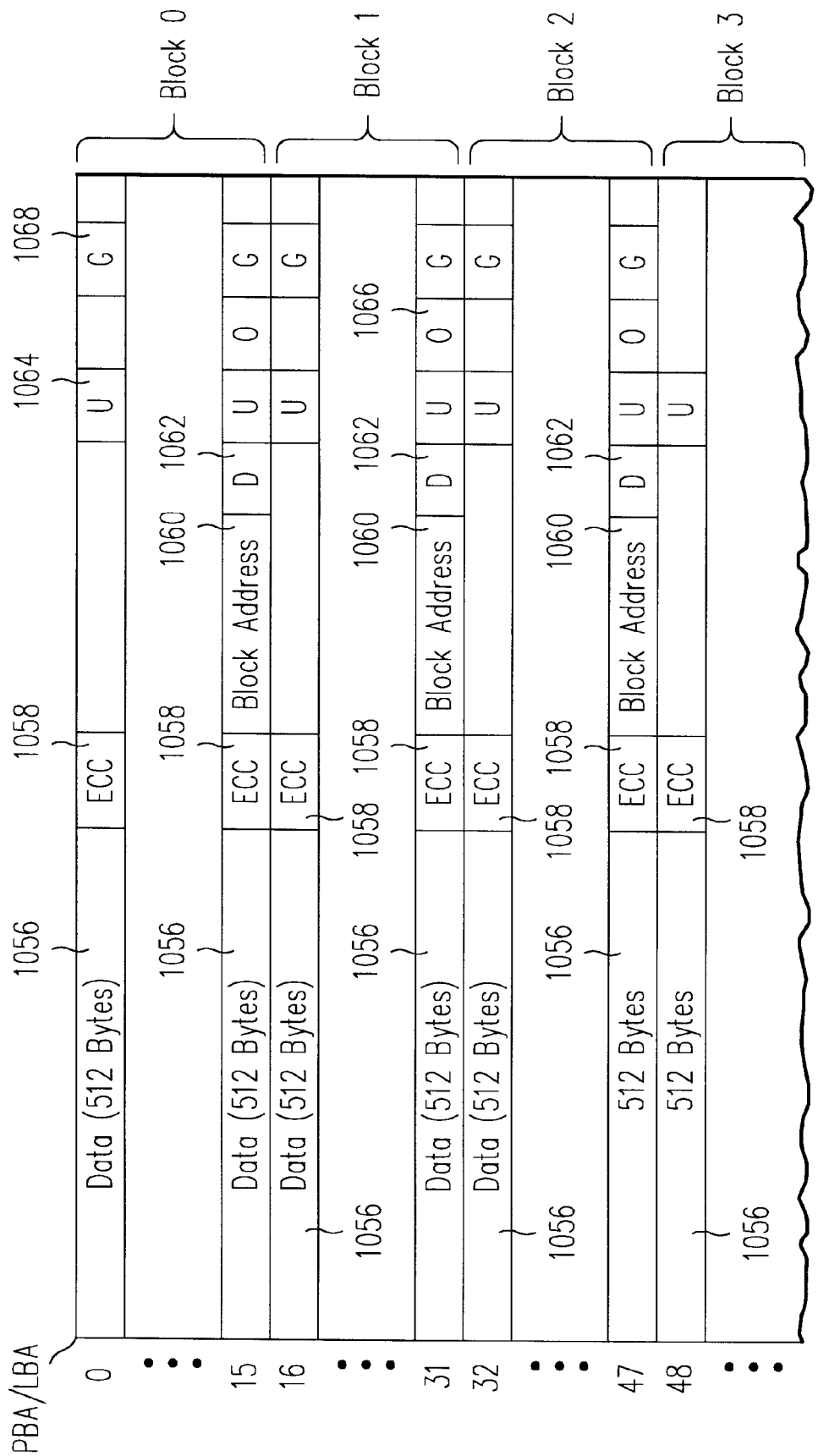

FIG. 28 illustrates an example to the contents of the memory unit 508 of the preferred embodiment described in FIGS. 24–26.

FIGS. 29–38 depict examples of the contents of the SPM RAM look-up-table in accordance with the preferred embodiments as shown in FIGS. 24–28.

DETAILED DESCRIPTION OF THE PREFERRED EMBODIMENT

FIG. 1 shows an architecture for implementation of a solid state storage media according to the present invention. The storage media is for use with a host or other external digital system. The mass storage is partitioned into two portions, a volatile RAM array 100 and a nonvolatile array 104. According to the preferred embodiment, all of the nonvolatile memory storage is FLASH. The FLASH may be replaced by EEPROM. The RAM can be of any convenient type. The memory storage 104 is arranged into N blocks of data from zero through N−1. Each of the blocks of data is M Bytes long. In the preferred embodiment, each data block is 512 Bytes long to correspond with a sector length in a commercially available hard disk drive plus the extra numbers of bytes to store the flags and logical block address (LBA) information and the associated ECC. The memory 104 can contain as much memory storage as a user desires. An example of a mass storage device might include 100 M Byte of addressable storage.

There are a plurality of RAM locations 102. Each RAM location 102 is uniquely addressable by controller using an appropriate one of the logical block addresses provided by the host system or the actual physical address of the non-volatile media. The RAM location 102 contains the physical block address of the data associated with the logical block address and the flags associated with a physical block address on the nonvolatile media.

It is possible that the physical block address (PBA) can be split into two fields as shown in FIG. 2. These fields can be used for cluster addresses of a group of data blocks. The first such field 290 is used to select a cluster address and the second such field 292 can be used to select the start address of the logical block address associated with this cluster.

A collection of information flags is also stored for each nonvolatile memory location 106. These flags include an old/new flag 110, a used/free flag 112, a defect flag 114, and a single/sector flag 116. Additionally, there is also a data store 122.

When writing data to the mass storage device of the present invention, a controller determines the first available physical block for storing the data. The RAM location 102 corresponding to the logical block address selected by the host is written with the physical block address where the data is actually stored within the nonvolatile memory array in 104 (FIG. 1).

Assume for example that a user is preparing a word processing document and instructs the computer to save the document. The document will be stored in the mass storage system. The host system will assign it a logical block address. The mass storage system of the present invention will select a physical address of an unused block or blocks in the mass storage for storing the document. The address of the physical block address will be stored into the RAM location 102 corresponding to the logical block address. As the data is programmed, the system of the present invention also sets the used free flag 112 in 104 and 293 to indicate that this block location is used. One used/free flag 112 is provided for each entry of the nonvolatile array 104.

Later, assume the user retrieves the document, makes a change and again instructs the computer to store the document. To avoid an erase-before-write cycle, the system of the present invention provides means for locating a block having its used/free flag 112 in 100 unset (not programmed) which indicates that the associated block is erased. The system then sets the used/free flag for the new block 112 of 106 and 293 of 100 and then stores the modified document in that new physical block location 106 in the nonvolatile array 104. The address of the new physical block location is also stored into the RAM location 102 corresponding the logical block address, thereby writing over the previous physical block location in 102. Next, the system sets the old/new flag 110 of the previous version of the document indicating that this is an old unneeded version of the document in 110 of 104 and 293 of 109. In this way, the system of the present invention avoids the overhead of an erase cycle which is required in the erase-before-write of conventional systems to store a modified version of a previous document.

Because of RAM array 100 will lose its memory upon a power down condition, the logical block address with the active physical block address in the media is also stored as a shadow memory 108 in the nonvolatile array 104. It will be understood the shadow information will be stored into the appropriate RAM locations 102 by the controller. During power up sequence, the RAM locations in 100 are appropriately updated from every physical locations in 104, by reading the information 106 of 104. The logical address 108 of 106 is used to address the RAM location of 100 to update the actual physical block address associated with the given logical block address. Also since 106 is the actual physical block address associated with the new data 122, the flags 110, 112, 114, and 116 are updated in 293 of 102 with the physical block address of 106 in 100. It will be apparent to one of ordinary skill in the art that the flags can be stored in either the appropriate nonvolatile memory location 106 or in both the nonvolatile memory location and also in the RAM location 102 associated with the physical block address.

During power up, in order to assign the most recent physical block address assigned to a logical block address in the volatile memory 100, the controller will first read the Flags 110, 112, 114, and 116 portion of the nonvolatile memory 104 and updates the flags portion 293 in the volatile memory 100. Then it reads the logical block address 108 of every physical block address of the nonvolatile media 104 and by tracking the flags of the given physical block address in the volatile memory 100, and the read logical block address of the physical block address in the nonvolatile memory 104, it can update the most recent physical block address assigned to the read logical block address in the volatile memory 100.

Figure 3:
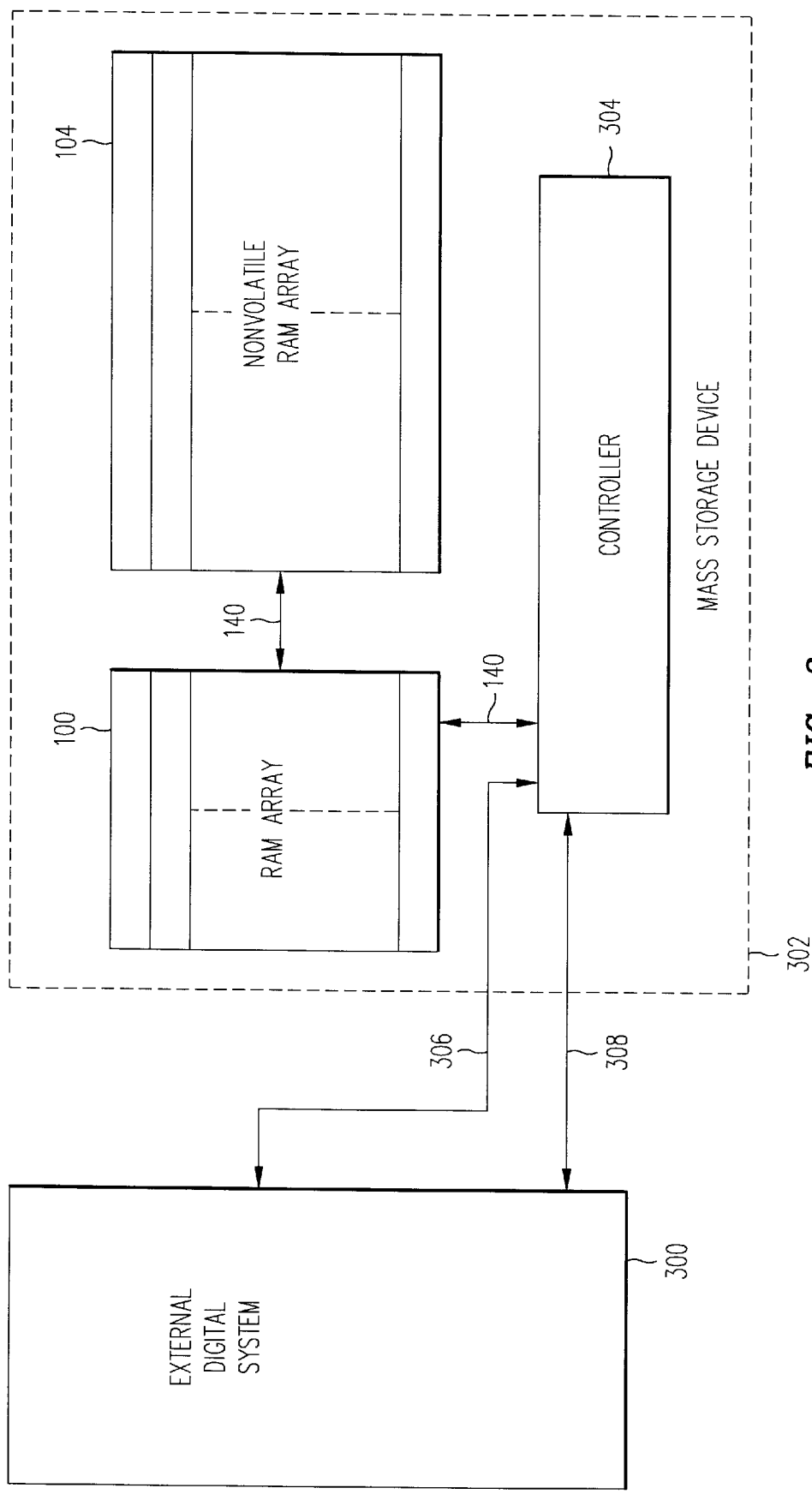
FIG. 3 shows a block diagram of a system incorporating the mass storage device of the present invention.

FIG. 3 shows a block diagram of a system incorporating the mass storage device of the present invention. An external digital system 300 such as a host computer, personal computer and the like is coupled to the mass storage device 302 of the present invention. A logical block address is coupled via an address bus 306 to the volatile RAM array 100 and to a controller circuit 304. Control signals are also coupled to the controller 304 via a control bus 308. The volatile RAM array 100 is coupled for providing the physical block address to the nonvolatile array 104. The controller 304 is coupled to control both the volatile RAM 100, the nonvolatile array 104, and for the generation of all flags.

A simplified example, showing the operation of the write operation according to the present invention is shown in FIGS. 4 through 8. Not all the information flags are shown to avoid obscuring these features of the invention in excessive detail. The data entries are shown using decimal numbers to further simplify the understanding of the invention. It will be apparent to one of ordinary skill in the art that in a preferred embodiment binary counting will be used.

FIG. 4 shows an eleven entry mass storage device according to the present invention. There is no valid nor usable data stored in the mass storage device of FIG. 4. Accordingly, all the physical block addresses are empty. The data stored in the nonvolatile mass storage location '6' is filled and old. Additionally, location '9' is defective and cannot be used.

The host directs the mass storage device of the example to write data pursuant to the logical block address '3' and then to '4'. The mass storage device will first write the data associated with the logical block address '3'. The device determines which is the first unused location in the nonvolatile memory. In this example, the first empty location is location '0'. Accordingly, FIG. 5 shows that for the logical block address '3', the corresponding physical block address '0' is stored and the used flag is set in physical block address '0'. The next empty location is location '1'. FIG. 6 shows that for the logical block address '4', the corresponding physical block address '1' is stored and the used flag is set in physical block address '1'.

The host instructs that something is to be written to logical block address '3' again. The next empty location is determined to be location '2'. FIG. 7 shows that the old flag in location '0' is set to indicate that this data is no longer usable, the used flag is set in location '2' and the physical block address in location '3' is changed to '2'.

Next, the host instructs that something is to be written to logical block address '4' again. The next empty location is determined to be location '3'. FIG. 8 shows that the old flag in location '1' is set to indicate that this data is no longer usable, the used flag is set in location '3' and the physical block address in location '4' is changed to '3'. (Recall that there is generally no relation between the physical block address and the data stored in the same location.)

Figure 9:
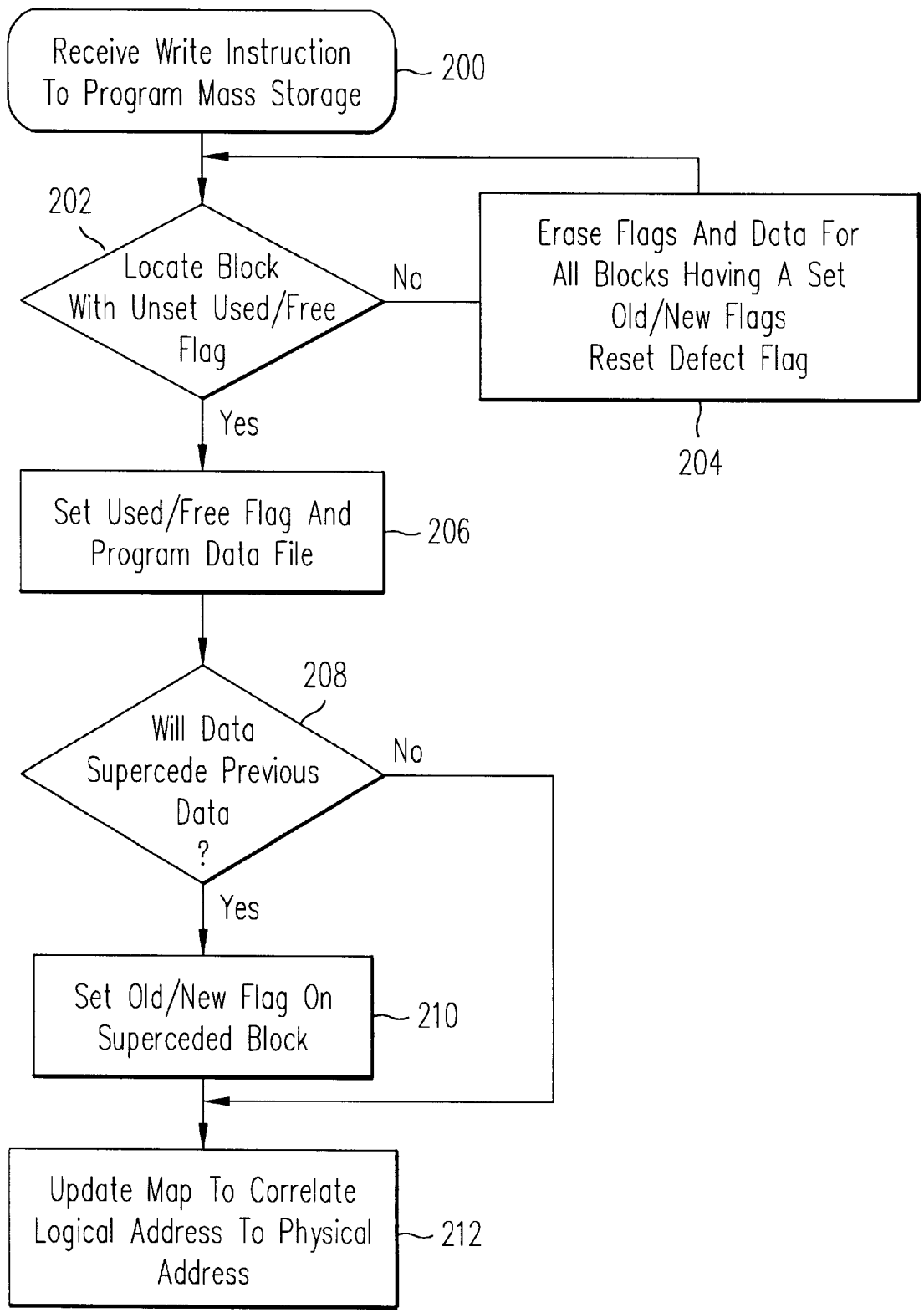
FIG. 9 shows a flow chart block diagram of the first algorithm according to the present invention.

FIG. 9 shows algorithm 1 according to the present invention. When the system of the present invention receives an instruction to program data into the mass storage (step 200), then the system attempts to locate a free block (step 202), i.e., a block having an unset (not programmed) used/free flag. If successful, the system sets the used/free flag for that block and programs the data into that block (step 206).

If on the other hand, the system is unable to locate a block having an unset used/free flag, the system erases the flags (used/free and old/new) and data for all blocks having a set old/new flag and unset defect flag (step 204) and then searches for a block having an unset used/free flag (step 202). Such a block has just been formed by step 204. The system then sets the used/flag for that block and programs the data file into that block (step 206).

If the data is a modified version of a previously existing file, the system must prevent the superseded version from being accessed. The system determines whether the data file supersedes a previous data file (step 208). If so, the system sets the old/new flag associated with the superseded block (step 210). If on the other hand, the data file to be stored is a newly created data file, the step of setting the old/new flag (step 210) is skipped because there is no superseded block. Lastly, the map for correlating the logical address 308 to the physical address is updated (step 212).

By following the procedure outlined above, the overhead associated with an erase cycle is avoided for each write to the memory 104 except for periodically. This vastly improves the performance of the overall computer system employing the architecture of the present invention.

In the preferred embodiment of the present invention, the programming of the flash memory follows the procedure commonly understood by those of ordinary skill in the art. In other words, the program impulses are appropriately applied to the bits to be programmed and then compared to the data being programmed to ensure that proper programming has occurred. In the event that a bit fails to be erased or programmed properly, a defect flag 114 is set which prevent that block from being used again.

Figure 10:
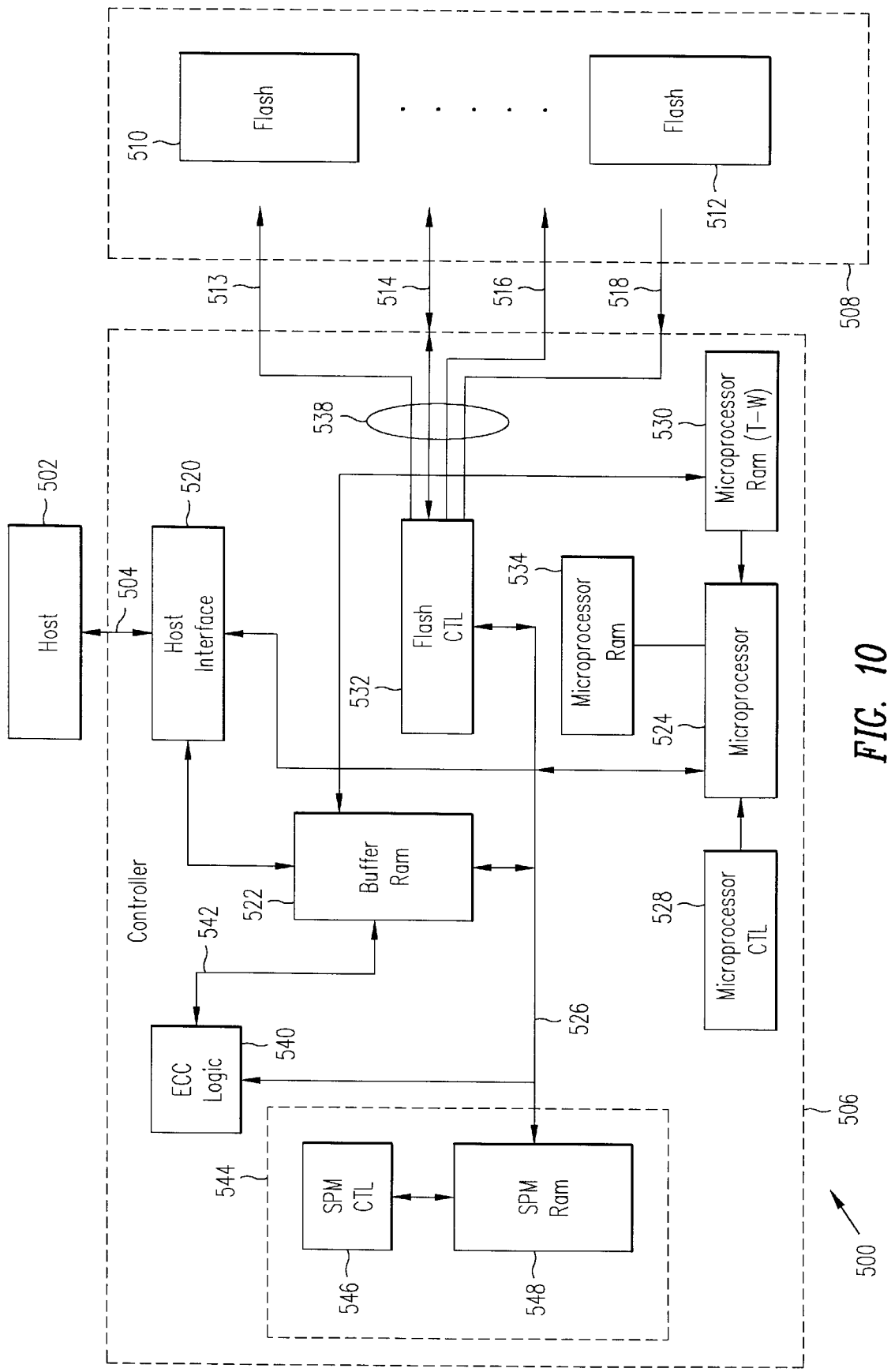
FIG. 10 shows a high-level block diagram of a digital system, such as a digital camera, including a preferred embodiment of the present invention.

FIG. 10 depicts a digital system 500 such as a digital camera employing an alternative embodiment of the present invention. Digital system 500 is illustrated to include a host 502, which may be a personal computer (PC) or simply a processor of any generic type commonly employed in digital systems, coupled to a controller circuit 506 for storing in and retrieving information from non-volatile memory unit 508.

The controller circuit 506 may be a semiconductor (otherwise referred to as an "integrated circuit" or "chip") or optionally a combination of various electronic components. In the preferred embodiment, the controller circuit is depicted as a single chip device. The non-volatile memory unit 508 is comprised of one or more memory devices, which may each be flash or EEPROM types of memory. In the preferred embodiment of FIG. 10, memory unit 508 includes a plurality of flash memory devices, 510–512, each flash device includes individually addressable locations for storing information. In the preferred application of the embodiment in FIG. 10, such information is organized in blocks with each block having one or more sectors of data. In addition to the data, the information being stored may further include status information regarding the data blocks, such as flag fields, address information and the like.

The host 502 is coupled through host information signals 504 to a controller circuit 506. The host information signals comprise of address and data busses and control signals for communicating command, data and other types of information to the controller circuit 506, which in turn stores such information in memory unit 508 through flash address bus 512, flash data bus 514, flash signals 516 and flash status signals 518 (508 and 513–516 collectively referred to as signals 538). The signals 538 may provide command, data and status information between the controller 506 and the memory unit 508.

The controller 506 is shown to include high-level functional blocks such as a host interface block 520, a buffer RAM block 522, a flash controller block 532, a microprocessor block 524, a microprocessor controller block 528, a microprocessor storage block 530, a microprocessor ROM block 534, an ECC logic block 540 and a space manager block 544. The host interface block 520 receives host information signals 504 for providing data and status information from buffer RAM block 522 and microprocessor block 524 to the host 502 through host information signals 504. The host interface block 520 is coupled to the microprocessor block 524 through the microprocessor information signals 526, which is comprised of an address bus, a data bus and control signals.

The microprocessor block 524 is shown coupled to a microprocessor controller block 528, a microprocessor storage block 530 and a microprocessor ROM block 534, and serves to direct operations of the various functional blocks shown in FIG. 10 within the controller 506 by executing program instructions stored in the microprocessor storage block 530 and the microprocessor ROM block 534. Microprocessor 524 may, at times, execute program instructions (or code) from microprocessor ROM block 534, which is a non-volatile storage area. On the other hand, microprocessor storage block 530 may be either volatile, i.e., read-and-write memory (RAM), or nonvolatile, i.e., EEPROM, type of memory storage. The instructions executed by the microprocessor block 524, collectively referred to as program code, are stored in the storage block 530 at some time prior to the beginning of the operation of the system of the present invention. Initially, and prior to the execution of program code from the microprocessor storage location 530, the program code may be stored in the memory unit 508 and later downloaded to the storage block 530 through the signals 538. During this initialization, the microprocessor block 524 can execute instructions from the ROM block 534.

Controller 506 further includes a flash controller block 532 coupled to the microprocessor block 524 through the microprocessor information signals 526 for providing and receiving information from and to the memory unit under the direction of the microprocessor. Information such as data may be provided from flash controller block 532 to the buffer RAM block 522 for storage (may be only temporary storage) therein through the microprocessor signals 526. Similarly, through the microprocessor signals 526, data may be retrieved from the buffer RAM block 522 by the flash controller block 532.

ECC logic block 540 is coupled to buffer RAM block 522 through signals 542 and further coupled to the microprocessor block 524 through microprocessor signals 526. ECC logic block 540 includes circuitry for generally performing error coding and correction functions. It should be understood by those skilled in the art that various ECC apparatus and algorithms are commercially available and may be employed to perform the functions required of ECC logic block 540. Briefly, these functions include appending code that is for all intensive purposes uniquely generated from a polynomial to the data being transmitted and when data is received, using the same polynomial to generate another code from the received data for detecting and potentially correcting a predetermined number of errors that may have corrupted the data. ECC logic block 540 performs error detection and/or correction operations on data stored in the memory unit 508 or data received from the host 502.

The space manager block 544 employs a preferred apparatus and algorithm for finding the next unused (or free) storage block within one of the flash memory devices for storing a block of information, as will be further explained herein with reference to other figures. As earlier discussed, the address of a block within one of the flash memory devices is referred to as PBA, which is determined by the space manager by performing a translation on an LBA received from the host. A variety of apparatus and method may be employed for accomplishing this translation. An example of such a scheme is disclosed in U.S. Pat. No. 5,485,595, entitled "Flash Memory Mass Storage Architecture Incorporating Wear Leveling Technique Without Using CAM Cells", the specification of which is herein incorporated by reference. Other LBA to PBA translation methods and apparatus may be likewise employed without departing from the scope and spirit of the present invention.

Space manager block 544 includes SPM RAM block 548 and SPM control block 546, the latter two blocks being coupled together. The SPM RAM block 548 stores the LBA-PBA mapping information (otherwise herein referred to as translation table, mapping table, mapping information, or table) under the control of SPM control block 546. Alternatively, the SPM RAM block 548 may be located outside of the controller, such as shown in FIG. 3 with respect to RAM array 100.

In operation, the host 502 writes and reads information from and to the memory unit 508 during for example, the performance of a read or write operation through the controller 506. In so doing, the host 502 provides an LBA to the controller 506 through the host signals 504. The LBA is received by the host interface block 520. Under the direction of the microprocessor block 524, the LBA is ultimately provided to the space manager block 544 for translation to a PBA and storage thereof, as will be discussed in further detail later.

Under the direction of the microprocessor block 524, data and other information are written into or read from a storage area, identified by the PBA, within one of the flash memory devices 510–512 through the flash controller block 532. The information stored within the flash memory devices may not be overwritten with new information without first being erased, as earlier discussed. On the other hand, erasure of a block of information (every time prior to being written), is a very time and power consuming measure. This is sometimes referred to as erase-before-write operation. The preferred embodiment avoids such an operation by continuously, yet efficiently, moving a sector (or multiple sectors) of information, within a block, that is being re-written from a PBA location within the flash memory to an unused PBA location within the memory unit 508 thereby avoiding frequent erasure operations. A block of information may be comprised of more than one sector such as 16 or 32 sectors. A block of information is further defined to be an individually-erasable unit of information. In the past, prior art systems have moved a block stored within flash memory devices that has been previously written into a free (or unused) location within the flash memory devices. Such systems however, moved an entire block even when only one sector of information within that block was being re-written. In other words, there is waste of both storage capacity within the flash memory as well as waste of time in moving an entire block's contents when less than the total number of sectors within the block are being re-written. The preferred embodiments of the present invention, as discussed herein, allow for "moves" of less than a block of information thereby decreasing the number of move operations of previously-written sectors, consequently, decreasing the number of erase operations.

Referring back to FIG. 10, it is important to note that the SPM RAM block 548 maintains a table that may be modified each time a write operation occurs thereby maintaining the LBA-PBA mapping information and other information regarding each block being stored in memory unit 508. Additionally, this mapping information provides the actual location of a sector (within a block) of information within the flash memory devices. As will be further apparent, at least a portion of the information in the mapping table stored in the SPM RAM block 548 is "shadowed" (or copied) to memory unit 508 in order to avoid loss of the mapping information when power to the system is interrupted or terminated. This is, in large part, due to the use of volatile memory for maintaining the mapping information. In this connection, when power to the system is restored, the portion of the mapping information stored in the memory unit 508 is transferred to the SPM RAM block 548.

It should be noted, that the SPM RAM block 548 may alternatively be nonvolatile memory, such as in the form of flash or EEPROM memory architecture. In this case, the mapping table will be stored within nonvolatile memory thereby avoiding the need for "shadowing" because during power interruptions, the mapping information stored in nonvolatile memory will be clearly maintained.

When one or more sectors are being moved from one area of the flash memory to another area, the preferred embodiment of the present invention first moves the sector(s) from the location where they are stored in the flash memory devices, i.e., 510–512, to the buffer RAM block 522 for temporary storage therein. The moved sector(s) are then moved from the buffer RAM block 522 to a free area within one of the flash memory devices. It is further useful to note that the ECC code generated by the ECC logic block 540, as discussed above, is also stored within the flash memory devices 510–512 along with the data, as is other information, such as the LBA corresponding to the data and flag fields.

FIGS. 11–21 are presented to show examples of the state of a table 700 in SPM RAM block 548 configured to store LBA-PBA mapping information for identification and location of blocks (and sectors within the blocks) within the memory unit 508. Table 700 in all of these figures is shown to include an array of columns and rows with the columns including virtual physical block address locations or VPBA block address locations 702, move virtual physical address locations or MVPBA block address locations 704, move flag locations 706, used/free flag locations 708, old/new flag locations 710, defect flag locations 712 and sector move status locations 714.

The rows of table include PBA/LBA rows 716, 718 through 728 with each row having a row number that may be either an LBA or a PBA depending upon the information that is being addressed within the table 700. For example, row 716 is shown as being assigned row number '00' and if PBA information in association with LBA '00' is being retrieved from table 700, then LBA '00' may be addressed in SPM RAM block 548 at row 716 to obtain the associated PBA located in 730. On the other hand, if status information, such as flag fields, 706–712, regarding a block is being accessed, the row numbers of rows 716–728, such as '00', '10', '20', '30', '40', '50', 'N–1' represent PBA, as opposed to LBA, values. Furthermore, each row of table 700 may be thought of as a block entry wherein each entry contains information regarding a block. Furthermore, each row of table 700 may be addressed by an LBA.

In the preferred embodiment, each block is shown to include 16 sectors. This is due to the capability of selectively erasing an entire block of 16 sectors (which is why the block size is sometimes referred to as an "erase block size". If an erase block size is 16 sectors, such as shown in FIGS. 11–21, each block entry (or row) includes information regarding 16 sectors. Row 716 therefore includes information regarding a block addressed by LBA '00' through LBA '15' (or LBA '00' through LBA '0F' in Hex. notation). The next row, row 718, includes information regarding blocks addressed by LBA '16' (or '10' in Hex.) through LBA '31' (or '1F' in Hex.) The same is true for PBAs of each block.

It should be noted however, other block sizes may be similarly employed. For example, a block may include 32 sectors and therefore have an erase block size of 32. In the latter situation, each block entry or row, such as 716, 718, 720 . . . , would include information regarding 32 sectors.

The VPBA block address locations 702 of table 700 stores information generally representing a PBA value corresponding to a particular LBA value. The MVPBA block address locations 704 store information representing a PBA value identifying, within the memory unit 508, the location of where a block (or sector portions thereof) may have been moved. The move flag locations 706 store values indicating whether the block being accessed has any sectors that may have been moved to a location whose PBA is indicated by the value in the MVPBA block address location 704 (the PBA value within 704 being other than the value indicated in VPBA block address 702 wherein the remaining block address information may be located). The used/new flag location 708 stores information to indicate whether the block being accessed is a free block, that is, no data has been stored since the block was last erased. The old/new flag location 710 stores information representing the status of the block being accessed as to whether the block has been used and re-used and therefore, old. The defect flag location 712 stores information regarding whether the block is defective. If a block is declared defective, as indicated by the value in the defect flag location 712 being set, the defective block can no longer be used. Flags 708–712 are similar to the flags 110–114 shown and described with respect to FIG. 1.

Sector move status location 714 is comprised of 16 bits (location 714 includes a bit for each sector within a block so for different-sized blocks, different number of bits within location 714 are required) with each bit representing the status of a sector within the block as to whether the sector has been moved to another block within the memory unit 508. The moved block location within the memory unit 508 would be identified by a PBA that is other than the PBA value in VPBA block address location 702. Said differently, the status of whether a sector within a block has been moved, as indicated by each of the bits within 714, suggests which one of either the VPBA block address locations 702 or the MBPBA block address locations 704 maintain the most recent PBA location for that sector.

Referring still to FIG. 11, an example of the status of the table 700 stored in SPM RAM block 548 (in FIG. 10) is shown when, by way of example, LBA '0' is being written. As previously noted, in the figures presented herein, a block size of sixteen sectors (number 0–15 in decimal notation or 0–10 in hexadecimal notation) is used to illustrate examples only. Similarly, N blocks (therefore N LBAS) are employed, numbered from 0–N–1. The block size and the number of blocks are both design choices that may vary for different applications and may depend upon the memory capacity of each individual flash memory device (such as 510–512) being employed. Furthermore, a preferred sector size of 512 bytes is used in these examples whereas other sector sizes may be employed without departing from the scope and spirit of the present invention.

Assuming that the operation of writing to LBA '0' is occurring after initialization or system power-up when all of the blocks within the flash memory devices 510–512 (in FIG. 10) have been erased and are thus free. The space manager block 548 is likely to determine that the next free PBA location is '00'. Therefore, '00' is written to 730 in VPBA block address 702 of row 716 wherein information regarding LBA '0' is maintained, as indicated in table 700 by LBA row number '00'. Since no need exists for moving any of the sectors within the LBA 0 block, the MVPBA block address 704 for row 716, which is shown as location 732 may include any value, such as an initialization value (in FIG. 11, 'XX' is shown to indicate a "don't care" state).

The value in 734 is at logic state '0' to show that LBA '0' block does not contain any moved sectors. Location 736 within the used flag 708 column of row 716 will be set to logic state '1' indicating that the PBA '0' block is in use. The state of location 738, representing the old flag 710 for row 716, is set to '0' to indicate that PBA '0' block is not "old" yet. Location 740 maintains logic state '0' indicating that the PBA '0' block is not defective and all of the bits in move status location 714 are at logic state '0' to indicate that none of the sectors within the LBA '0' through LBA '15' block have been moved.

In FIG. 11, the status information for LBA '0' in row 716, such as in move flag location 706, used flag location 708, old flag location 710, defect flag location 712 and move status location 714 for all remaining rows, 716–728, of table 700 are at logic state '0'. It is understood that upon power-up of the system and/or after erasure of any of the blocks, the entries for the erased blocks, which would be all blocks upon power-up, in table 700, are all set to logic state '0'.

At this time, a discussion of the contents of one of the flash memory devices within the memory unit 508, wherein the LBA '0' block may be located is presented for the purpose of a better understanding of the mapping information shown in table 700 of FIG. 11.

Figure 22:
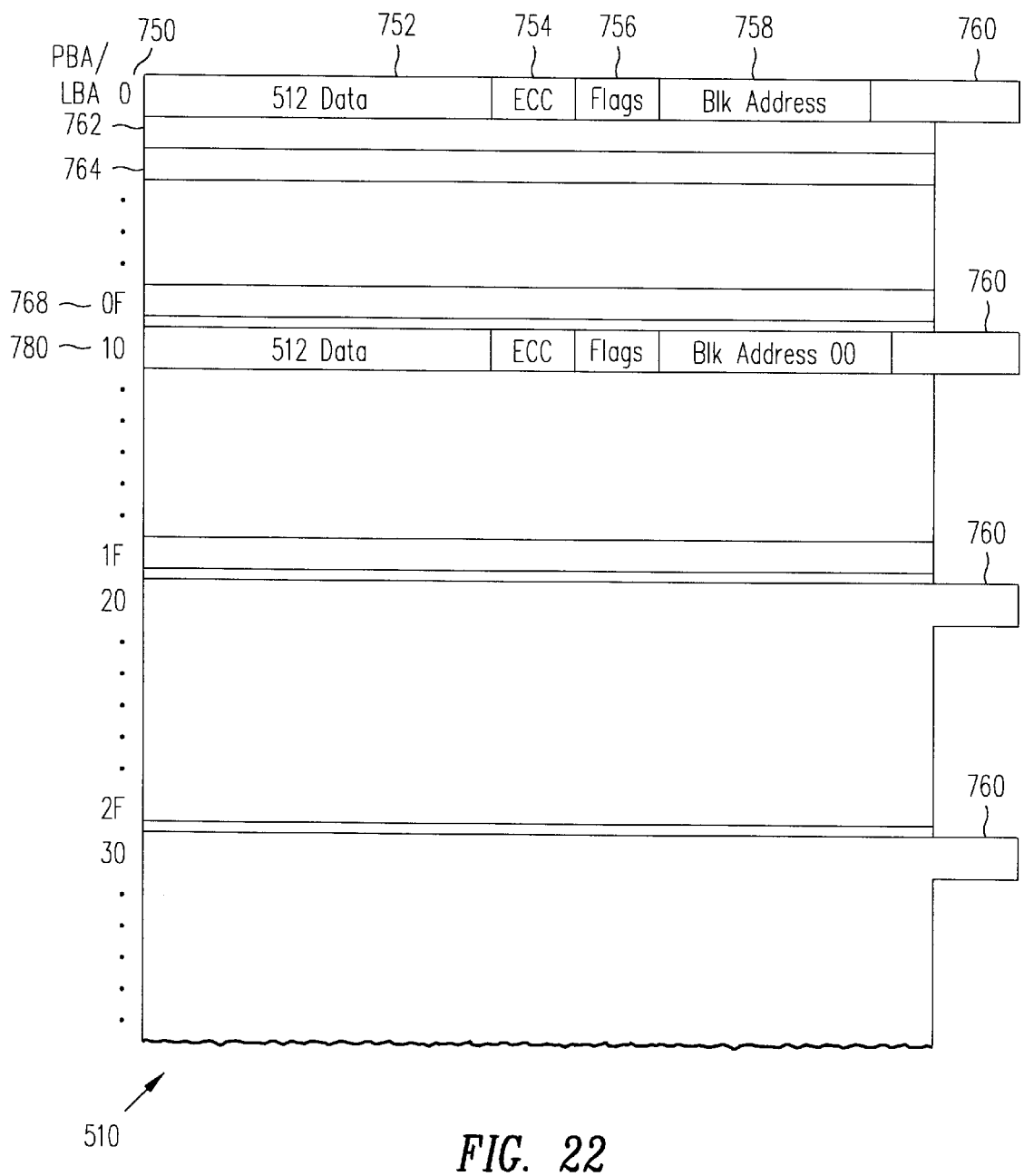
FIG. 22 depicts an example of a nonvolatile memory device employed in the preferred embodiment of FIG. 10.

Turning now to FIG. 22, an example is illustrated of the contents of the flash memory device 510 in accordance with the state of table 700 (as shown in FIG. 11). LBA '0', which within the memory unit 508 is identified at PBA '0' by controller 506 (of FIG. 10) is the location wherein the host-identified block is written. A PBA0 row 750 is shown in FIG. 22 to include data in sector data location 752. An ECC code is further stored in ECC location 754 of PBA0 row 750. This ECC code is generated by the ECC logic block 540 in association with the data being written, as previously discussed. Flag field 756 in PBA0 row 750 contains the move, used, old and defect flag information corresponding to the sector data of the block being written. In this example, in flag field 756, the "used" flag and no other flag is set, thus, flag field 756 maintains a logic state of '0100' indicating that PBA '0' is "used" but not "moved", "old" or "defective".

PBA0 row 750 additionally includes storage location for maintaining in LBA address location 758, the LBA number corresponding to PBA '0', which in this example, is '0'. While not related to the example at hand, the remaining PBA locations of LBA '0' are stored in the next 15 rows following row 750 in the flash memory device 510.

It will be understood from the discussion of the examples provided herein that the information within a PBA row of flash memory device 510 is enough to identify the data and status information relating thereto within the LBA '0' block including any moves associated therewith, particularly due to the presence of the "move" flag within each PBA row (750, 762, 764,) of the flash memory. Nevertheless, alternatively, another field may be added to the first PBA row of each LBA location within the flash, replicating the status of the bits in the move status location 714 of the corresponding row in table 700. This field is optionally stored in sector status location 760 shown in FIG. 22 to be included in the first PBA row of each LBA block, such as row 750, 780 and so on. Although the information maintained in location 760 may be found by checking the status of the "move" flags within the flag fields 756 of each PBA row, an apparent advantage of using location 760 is that upon start-up (or power-on) of the system, the contents of table 700 in SPM RAM block 548 may be updated more rapidly due to fewer read operations (the reader is reminded that table 700 is maintained in SPM RAM 548, which is volatile memory whose contents are lost when the system is power-down and needs to be updated upon power-up from nonvolatile memory, i.e. memory unit 508).

That is, rather than reading every PBA row (altogether 16 rows in the preferred example) to update each LBA entry of the table 700 upon power-up, only the first PBA row of each LBA must be read from flash memory and stored in SPM RAM 548 thereby saving time by avoiding needless read operations. On the other hand, clearly more memory capacity is utilized to maintain 16 bits of sector status information per LBA.

In the above example, wherein location 760 is used, the value in sector status location 760 would be all '0's (or '0000' in hexadecimal notation).

In flash memory device 510, each of the rows 750, 762, 764, 768 . . . , is a PBA location with each row having a PBA row number and for storing data and other information (data and other information are as discussed above with respect to row 750) for a sector within a block addressed by a particular LBA. Furthermore, every sixteen sequential PBA rows represents one block of information. That is, PBA rows 750, 762, 764 through 768, which are intended to show 16 PBA rows correspond to LBA 0 (shown as row 716 in table 700 of FIG. 11) and each of the PBA rows maintains information regarding a sector within the block. The next block of information is for the block addressed by LBA '10' (in Hex.) whose mapping information is included in row 718 of table 700, and which is stored in locations starting from '10' (in hexadecimal notation, or '16' in decimal notation) and ending at '1F' (in hexadecimal notation, or '31') in the flash memory device 510 and so on.

Continuing on with the above example, FIG. 12 shows an example of the state of table 700 when LBA 0 is again being written by the host. Since LBA 0 has already been written and is again being written without first being erased, another free location within the memory unit 508 (it may serve helpful to note here that the blocks, including their sectors, are organized sequentially and continuously through each of the flash memory devices of memory unit 508 according to their PBAs such that for example, the next flash memory device following device 510 picks up the PBA-addressed blocks where flash memory device 510 left off, an example of this is where flash memory device 510 includes PBAs of 0-FF (in Hex.) and the next flash memory device, which may be 512, may then include 100-1FF (in Hex.)) is located by space manager 544 for storage of the new information. This free location is shown to be PBA '10' (in Hexadecimal notation, or 16 in decimal notation). In row 718, where the entries for LBA '10' will remain the same as shown in FIG. 11 except the used flag in location 742 will be set (in the preferred embodiment, a flag is set when it is at logic state '1' although the opposite polarity may be used without deviating from the present invention) to indicate that the PBA '10' is now "in use".

The entries in row 716 are modified to show '10' in MVPBA block address location 732, which provides the PBA address of the moved portion for the LBA '00' block. The move flag in location 734 is set to logic state '1' to indicate that at least a portion (one or more sectors) of the LBA '00' block have been moved to a PBA location other than the PBA location indicated in location 730 of table 700. Finally, the bits of the move status location 714 in row 716 are set to '1000000000000000' (in binary notation, or '8000' in hexadecimal notation), reflecting the status of the moved sectors within the block LBA '00'. That is, in this example, '8000' indicates that the first sector, or sector '0', within LBA '00' block has been moved to a different PBA location.

Referring now to FIG. 22, the state of table 700 in FIG. 12 will affect the contents of the flash memory device 510 in that the moved sector of the LBA '0' block will now be written to PBA '10' in row 780. Row 780 will then include the data for the moved sector, which is 512 bytes in size. With respect to the moved sector information, row 780 further includes ECC code, a copy of the values in flag locations 734–740 of table 700 (in FIG. 12), and LBA '00' for indicating that the data in row 780 belongs to LBA '00' and may further include the move status for each of the individual sectors within the LBA '0' block.

While not specifically shown in the figure, the move flag within location 756 of PBA row 750 is set to indicate that at least a portion of the corresponding block has been moved. The value stored in the move status location 714 of row 716 (in FIG. 12), which is '8000' in Hex., is also stored within location 760 of the row 750. As earlier noted, this indicates that only sector '0' of PBA '0' was marked "moved" and the new block LBA '0' was written to PBA '10' in flash memory. Without further detailed discussions of FIG. 22, it should be appreciated that the examples to follow likewise affect the contents of the flash memory device 510.

Figure 13:
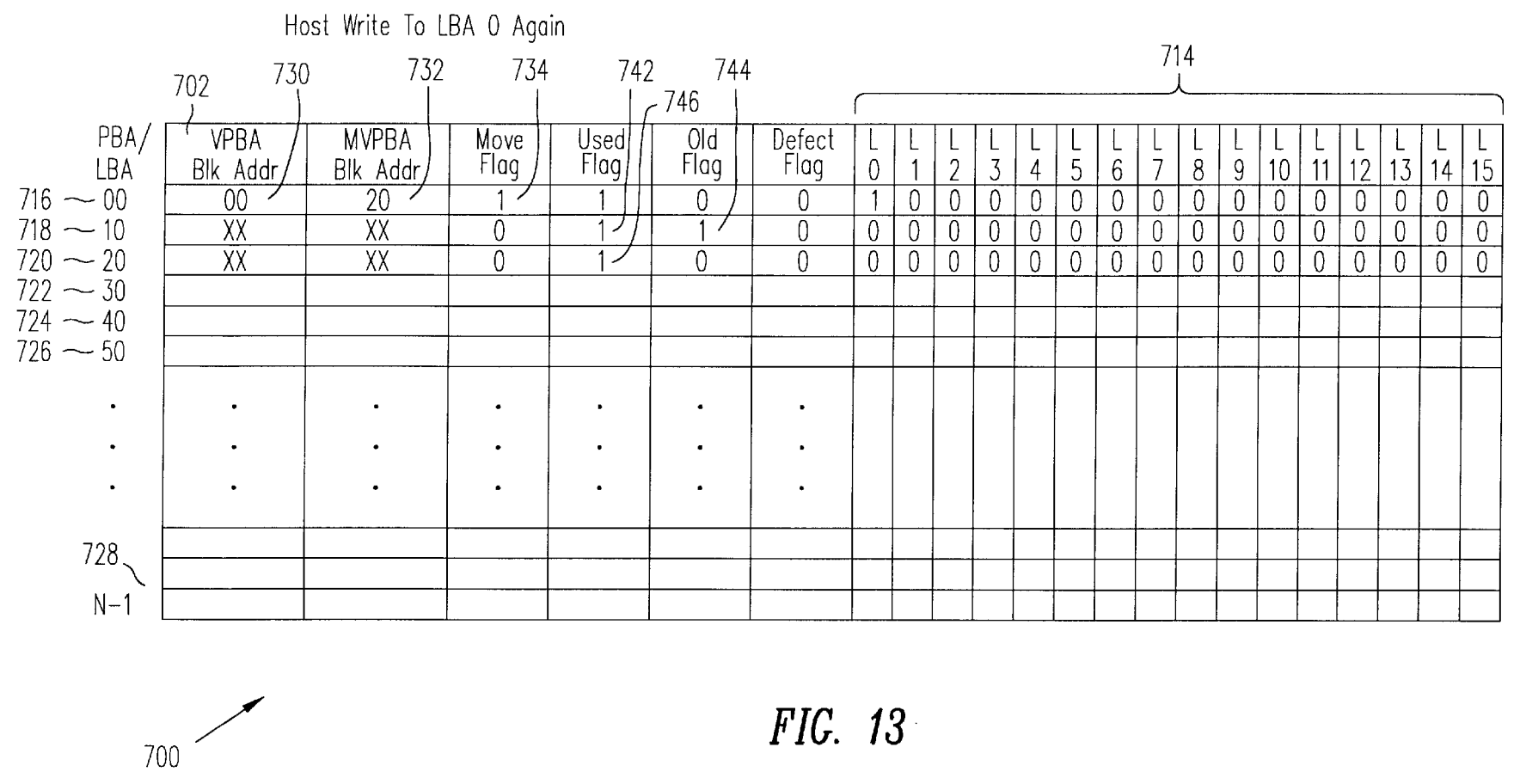

FIG. 13 shows the status of table 700 when yet another write operation to LBA '00' is performed. The values (or entries) in row 716 remain the same as in FIG. 12 except that the value in location 732 is changed to '20' (in Hex. Notation) to indicate that the moved portion of block LBA '00' is now located in PBA location '20' (rather than '10' in FIG. 12). As in FIG. 12, the value in move status location 714, '8000', indicates that the first sector (with PBA '00') is the portion of the block that has been moved.

Row 718 is modified to show that the LBA '10' block is now old and can no longer be used before it is erased. This is indicated by the value in location 744 being set to logic state '1'. The entries for LBA '20', row 720, remain unchanged except that location 746 is modified to be set to logic state '1' for reflecting the state of the PBA '20' block as being in use. It is understood that as in FIGS. 11 and 12, all remaining values in table 700 of FIG. 13 that have not been discussed above and are not shown as having a particular logic state in FIG. 13 are all unchanged (the flags are all set to logic state '0').

Figure 14:
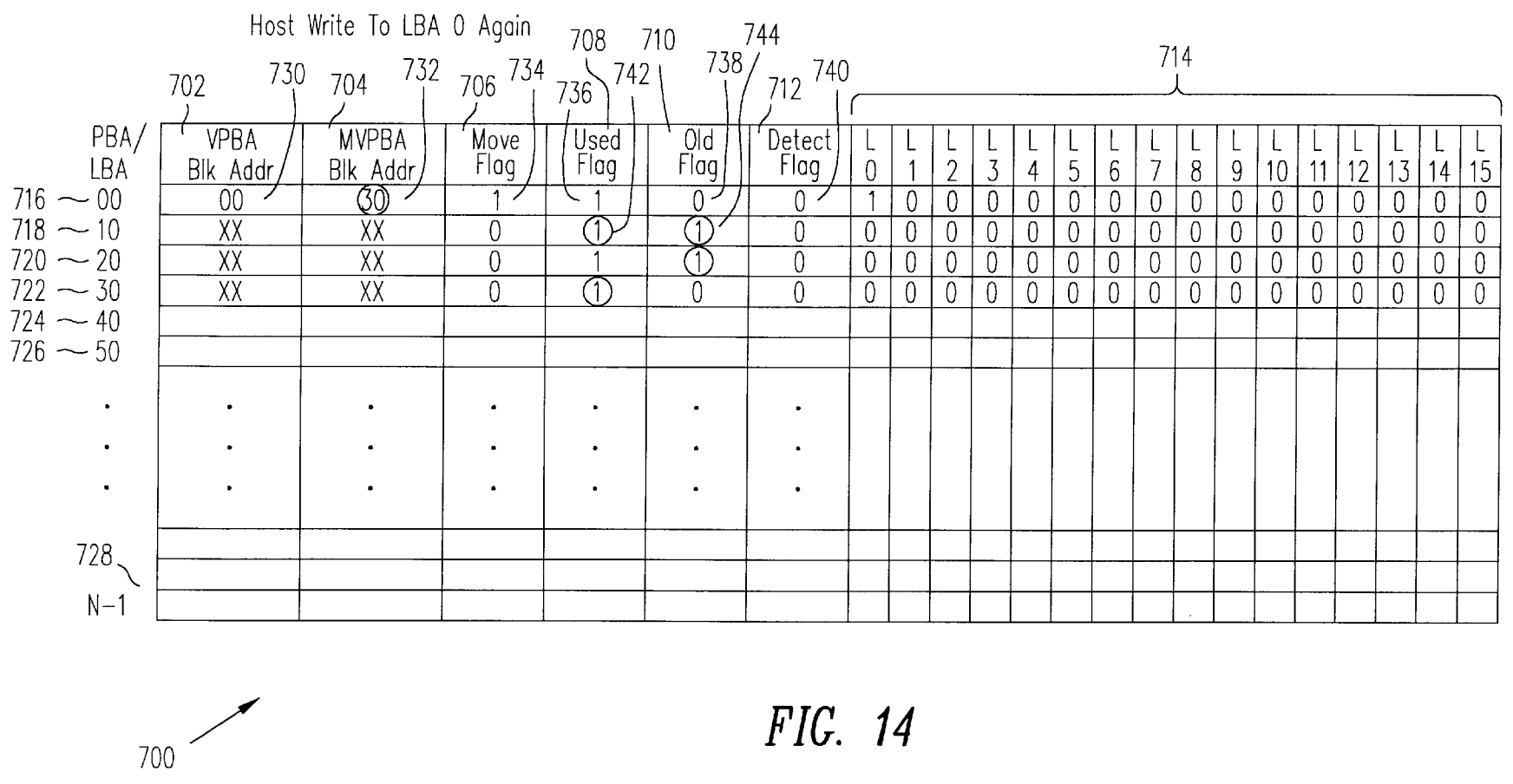

Continuing further with the above example, FIG. 14 shows the state of table 700 when yet another write to LBA '0' occurs. For ease of comparison, there is a circle drawn around the values shown in FIG. 14, which are at a different logic state with respect to their states shown in FIG. 13. In row 716, everything remains the same except for the new moved location, indicated as PBA '30', shown in location 732. PBA '30' was the next free location found by the space manager 544. As previously noted, this value indicates that a portion of the block of LBA '0' is now in PBA '30'; namely, the first sector (shown by the value in 714 of row 716 being '8000') in that block has been moved to PBA '30' in the flash memory device 510.

Row 718 remains the same until it is erased. The flags in locations 742 and 744 are set to logic state '0'. Row 720 also remains unchanged except for the value in its old flag 710 column being modified to '1' to show that the block of PBA '20' is also old and can not be used until first erased. Row 722 remains the same except for the value in its used flag 708 column being changed to logic state '1' to show that the block of LBA '30' is now in use.

Figure 15:
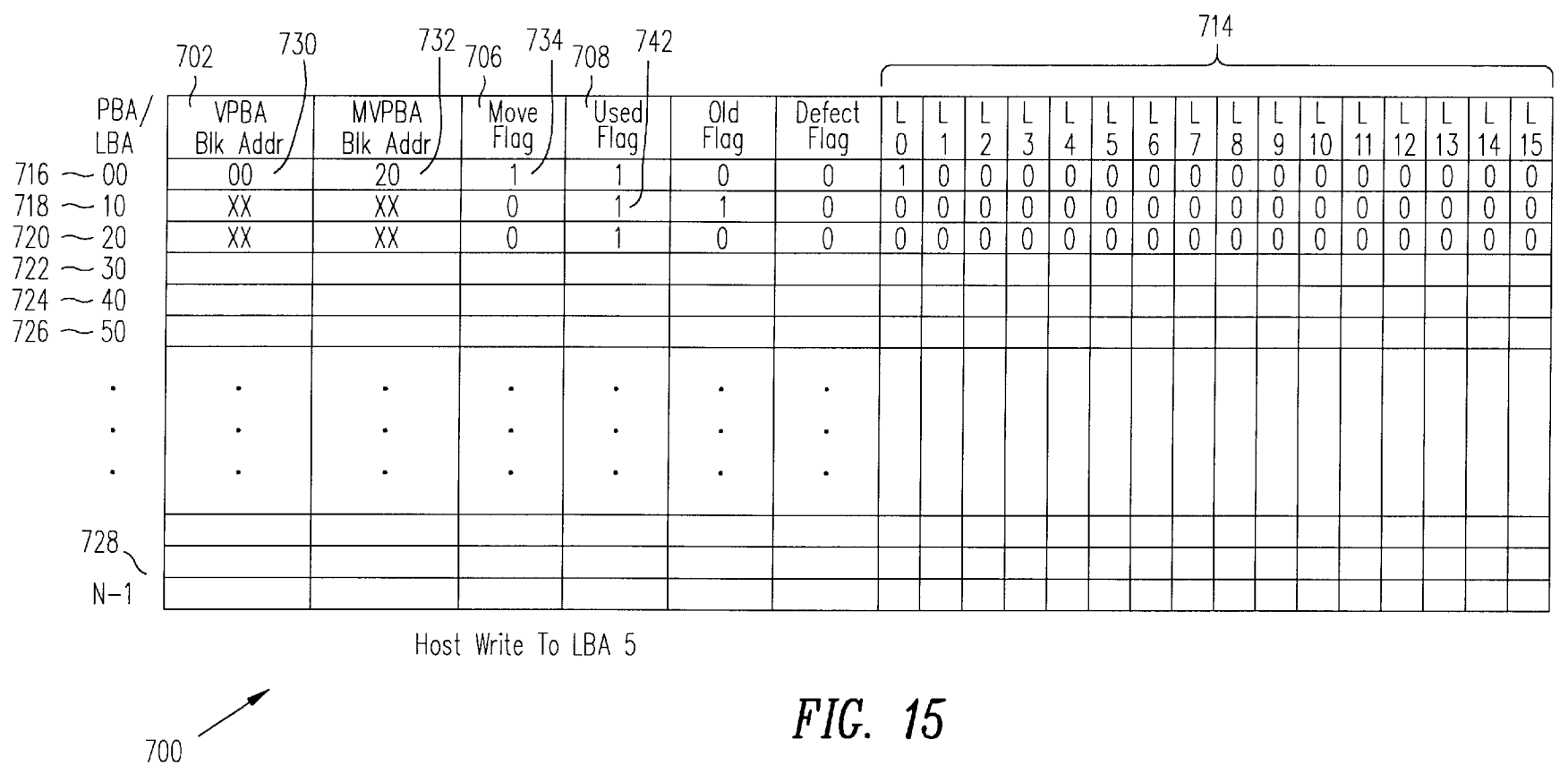

FIG. 15 is another example of the state of table 700, showing the state of table 700 assuming that the table was at the state shown in FIG. 13 and followed by the host writing to LBA '5'. Again, the changes to the values in table 700 from FIG. 13 to FIG. 15 are shown by a circle drawn around the value that has changed, which is only one change.

When writing to LBA '5', it should be understood that the LBA entries of rows 716, 718, 720, etc. are only for LBA '00', LBA '10', LBA '20', so on, and therefore do not reflect an LBA '5' entry. The reader is reminded that each of the LBA row entries is for a block of information with each block being 16 sectors in the preferred embodiment. For this reason, LBA '5' actually addresses the fifth sector in row 716. Since PBA '20' was used to store LBA '0', only the sector within PBA '20', corresponding to LBA '5', is yet not written and "free". Therefore, the data for LBA '5' is stored in PBA '20' in sector '5'. The move status location 714 of row 716 will be modified to logic state '8400' (in Hex. Notation). This reflects that the location of the first and fifth sectors within LBA '0' are both identified at PBA '20' in the flash memory device 510. The remaining values in table 700 of FIG. 15 remain the same as those shown in FIG. 13.

Figure 18:
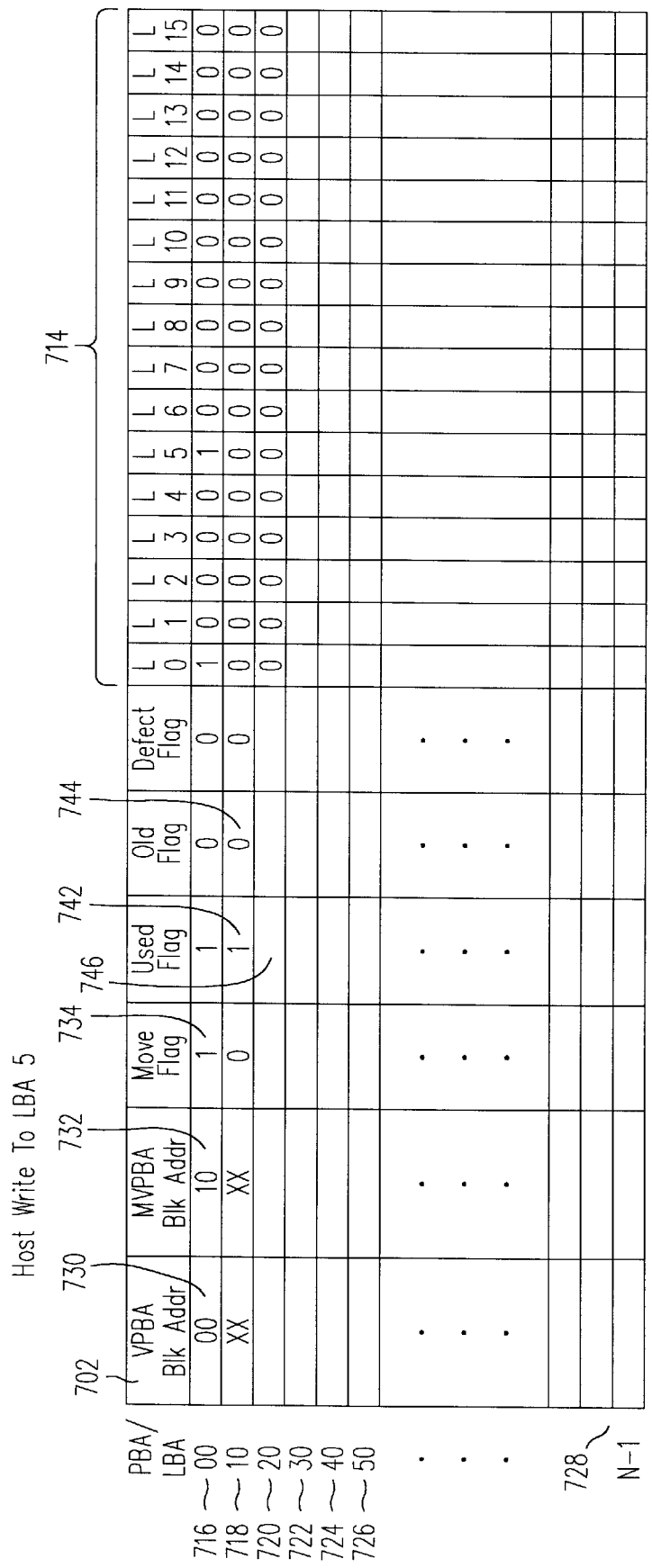

FIGS. 16–18 show yet another example of what the state of table 700 may be after either power-up or erasure of the blocks with the memory unit 508. In FIGS. 16 and 17, the same write operations as those discussed with reference to FIGS. 11 and 12 are performed. The state of table 700 in FIGS. 16 and 17 resembles that of FIGS. 11 and 12, respectively (the latter two figures have been re-drawn as FIGS. 16 and 17 for the sole convenience of the reader). Briefly, FIG. 16 shows the state of table 700 after a write to LBA '0' and FIG. 17 shows the state of table 700 after another write to LBA '0'.

FIG. 18 picks up after FIG. 17 and shows the state of table 700 after the host writes to LBA '5'. As indicated in FIG. 18, LBA '5' has been moved to PBA '10' where LBA '0' is also located. To this end, MBPBA block address location 732 is set to '10' in row 716 and the move flag is set at location 734 in the same row. Moreover, the state of move status location 714 in row 716 is set to '8400' (in Hex.) indicating that LBA '0' and LBA '5' have been moved, or that the first and fifth sectors within LBA '00' are moved. Being that these two sectors are now located in the PBA '10' location of the flash memory device 510, the move flag for each of the these sectors are also set in the flash memory device 510. It should be understood that LBA '5' was moved to PBA '10' because remaining free sectors were available in that block. Namely, even with LBA '0' of that block having been used, 15 other sectors of the same block were available, from which the fifth sector is now in use after the write to LBA '5'.

Continuing on with the example of FIG. 18, in FIG. 19, the state of the table 700 is shown after the host writes yet another time to LBA '0'. According to the table, yet another free PBA location, '20', is found where both the LBA '5' and LBA '0' are moved. First, LBA '5' is moved to the location PBA '10' to PBA '20' and then the new block of location LBA '0' is written to PBA '20'. As earlier discussed, any time there is a move of a block (for example, here the block of LBA '5' is moved) it is first moved from the location within flash memory where it currently resides to a temporary location within the controller 506, namely with the buffer RAM block 522, and then it is transferred from there to the new location within the flash memory devices.

The used flag in location 746 of row 720 is set to reflect the use of the PBA '20' location in flash memory and the old flag in location 744 is set to discard use of PBA '10' location until it is erased. Again, in flash memory, the state of these flags as well as the state of the move flag for both the LBA '0' and LBA '5' sectors are replicated.

Figure 20:
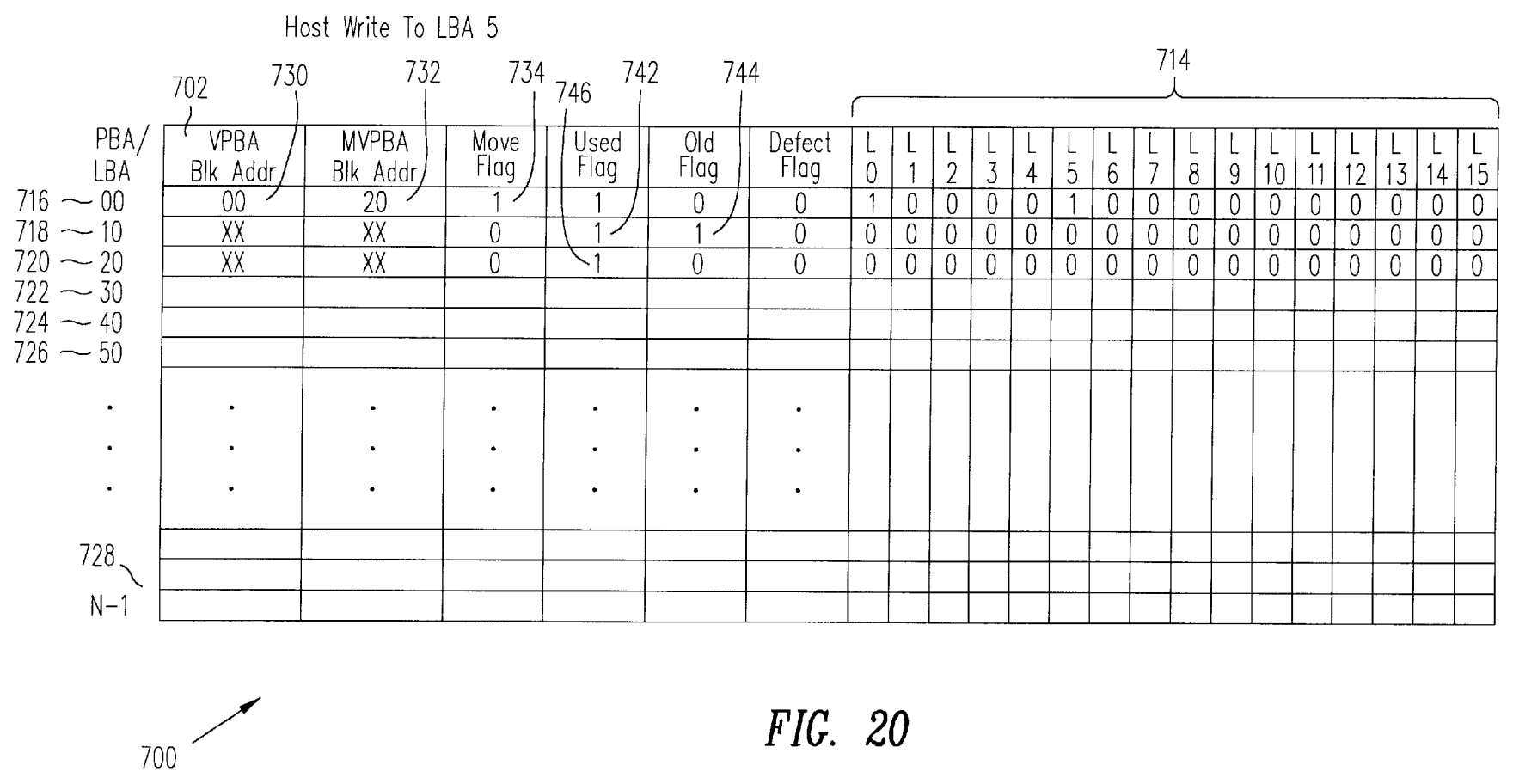

FIG. 20 picks up from the state of the table 700 shown in FIG. 18 and shows yet another state of what the table 700 may be after the host writes to LBA '5'. In this case, the block of LBA '0' is first moved from location PBA '10' within the flash memory device 510 wherein it is currently stored to location PBA '20' of the flash memory. Thereafter, the new block being written to LBA '5' by the host is written into location PBA '20' of the flash memory. The flags in both table 700 and corresponding locations of the flash memory device 510 are accordingly set to reflect these updated locations.

FIG. 21 also picks up from the state of the table 700 shown in FIG. 18 and shows the state of what the table 700 may be after the host writes to LBA '7'. In this case, the new block is simply written to location PBA '10' of the flash memory since that location has not yet been used. Additionally, three of the bits of the move status location 714 in row 716 are set to show that LBA '0', LBA '5' and LBA '7' have been moved to another PBA location within the flash memory. Location 732 shows that the location in which these three blocks are stored is PBA '10'.

As may be understood from the discussion presented thus far, at some point in time, the number of sectors being moved within a block makes for an inefficient operation. Thus, the need arises for the user to set a threshold for the number of sectors within a block that may be moved before the block is declared "old" (the old flag is set) and the block is no longer used, until it is erased. This threshold may be set at, for example, half of the number of sectors within a block. This is demonstrated as follows: For a block having 16 sectors, when 8 of the sectors are moved into another block, the "original" block and the "moved" block (the block in which the moved sectors reside) are combined into the same PBA block. The combined PBA block may be stored in a new block altogether or, alternatively, the "original" block may be combined with and moved into the "moved" block. In the latter case, the "original" block is then marked as "old" for erasure thereof. If the combined PBA block is stored in a new block, both of the "original" and the "moved" blocks are marked as "old".

Figure 23:
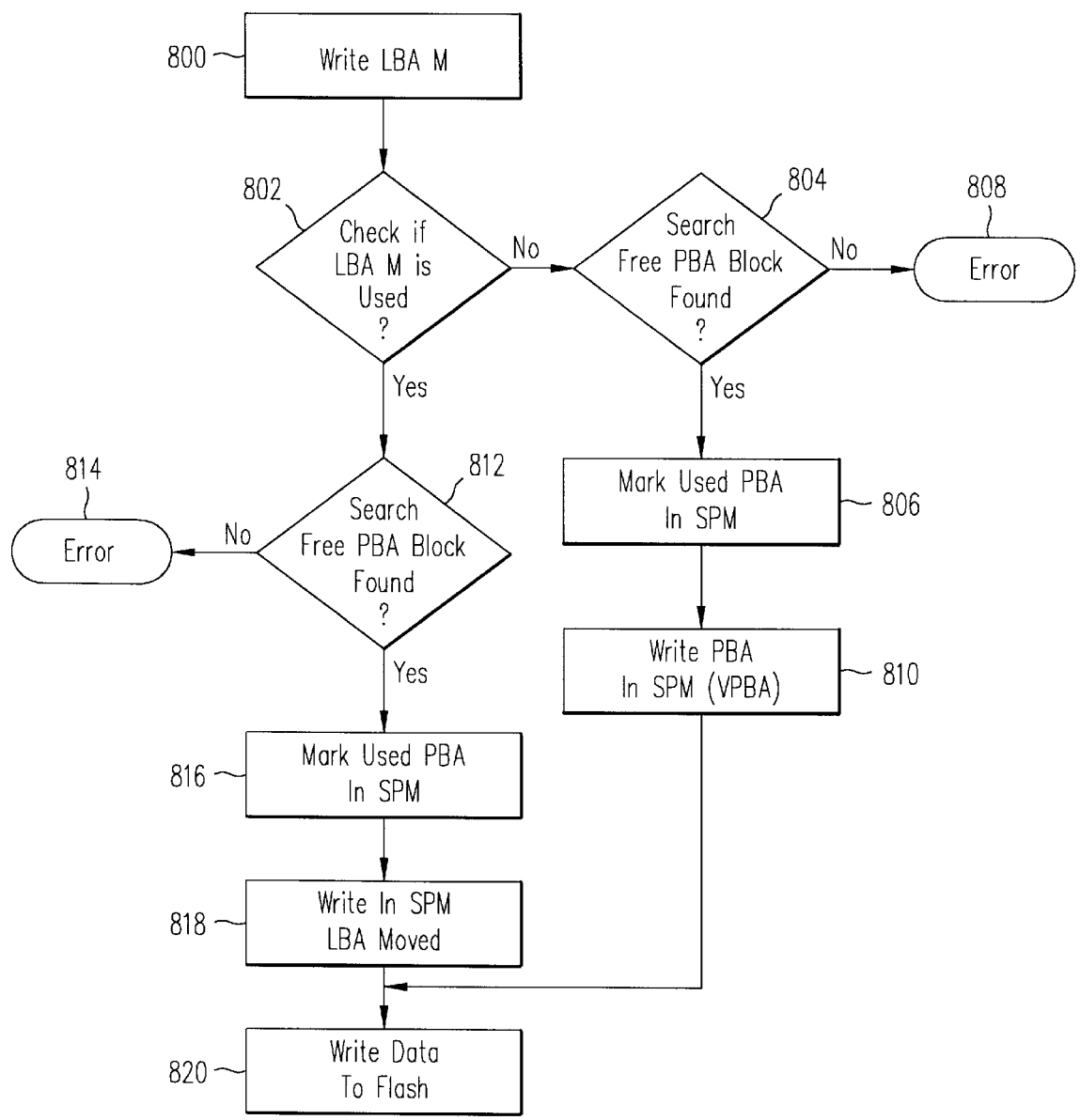
FIG. 23 shows a high-level flow chart of the general steps employed in writing a block of information to the nonvolatile devices of FIG. 10.

FIG. 23 depicts a general flow chart outlining some of the steps performed during a write operation. It is intended to show the sequence of some of the events that take place during such an operation and is not at all an inclusive presentation of the method or apparatus used in the preferred embodiment of the present invention.

The steps as outlined in FIG. 23 are performed under the direction of the microprocessor block 524 as it executes program code (or firmware) during the operation of the system.

When the host writes to a block of LBA M, step 800, the space manager block 544, in step 802, checks as to whether LBA M is in use by checking the state of the corresponding used flag in table 700 of the SPM RAM block 548. If not in use, in step 804, a search is performed for the next free PBA block in memory unit 508. If no free blocks are located, an "error" state is detected in 808. But where a free PBA is located, in step 806, its used flag is marked (or set) in table 700 as well as in flash memory. In step 810, the PBA of the free block is written into the VPBA block address 702 location of the corresponding LBA row in table 700.

Going back to step 802, if the LBA M block is in use, search for the next free PBA block is still conducted in step 812 and upon the finding of no such free block, at 814, an "error" condition is declared. Whereas, if a free PBA location is found, that PBA is marked as used in table 700 and flash memory, at step 816. Next, in step 818, the state of the block is indicated as having been moved by setting the move flag as well as the setting the appropriate bit in the move status location 714 of table 700. The new location of where the block is moved is also indicated in table 700 in accordance with the discussion above.

Finally, after steps 818 and 810, data and all corresponding status information, ECC code and LBA are written into the PBA location within the flash memory.

As earlier indicated, when a substantial portion of a block has sectors that have been moved (in the preferred embodiment, this is eight of the sixteen sectors), the block is declared "old" by setting its corresponding "old" flag. Periodically, blocks with their "old" flags set, are erased and may then be re-used (or re-programmed, or re-written).

As can be appreciated, an advantage of the embodiments of FIGS. 10–23 is that a block need not be erased each time after it is accessed by the host because if for example, any portions (or sectors) of the block are being re-written, rather than erasing the block in the flash memory devices or moving the entire block to a free area within the flash, only the portions that are being re-written need be transferred elsewhere in flash, i.e. free location identified by MVPA block address. In this connection, an erase cycle, which is time consuming is avoided until later and time is not wasted in reading an entire block and transferring the same.

Improvements to the various embodiments of the present invention, as described thus far, are hereinafter disclosed for efficiently transferring single sectors that are addressed in sequential order by the host and that are also being re-written under the direction of the controller 506 (in FIG. 10). As will be apparent to those skilled in the art, while such improvements include moving sectors within a block from a first area within the nonvolatile memory to an unused area within the nonvolatile memory, there is less storage area utilized within the controller thereby providing a smaller and less expensive solution. Specifically, the need for maintaining: 1) MBPBA block address locations 704 and sector move status locations 714 (shown in FIGS. 11–21) within the SPM RAM block 548 of the controller 506 (shown in FIG. 10); and 2) sector status locations 760 for every block in the memory unit 508 (shown in FIG. 10), as disclosed hereinabove with respect to the embodiment of FIGS. 10–23, is avoided. Furthermore, the number of operations necessary for performing such sequential single sector moves is substantially decreased thereby yielding higher system performance.

One embodiment of such an improvement of the present invention, is shown in flow chart form in FIGS. 24–26, to utilize the digital system 500 of FIG. 10 to reduce the number of read and write cycles associated with re-writing single sectors which are arranged in sequential order.

In systems such as digital cameras, for example, wherein the digital system 500 of the present invention may be employed, the host 502 (in FIG. 10), under the direction of the controller 506, commonly transfers a large quantity of information in the form of picture frames with each frame typically having 1648 sectors for storage within the flash memory unit 508. In such applications, information received by the controller 506, from the host 502, is generally arranged in sectors that are in sequential order. For example, as will be discussed through examples provided hereinbelow, the host may command the controller to store data in sectors addressed LBA 5 through LBA 15. As will be apparent shortly, the improved embodiments of the present invention, take advantage of the sequential addressing of sectors by the host when such sectors are being re-accessed in such a way as to avoid unnecessary sector transfers while yet avoiding the need for erase-before-write operations. As stated above, such an improvement utilizes the structure shown in FIG. 10 in conjunction with the method of FIGS. 24–26 outlined in flow chart form.

Most of the steps outlined in FIGS. 24–26 are performed by the microprocessor block 524, included within the controller 506 of FIG. 10. The microprocessor block 524 executes instructions that are stored in the microprocessor RAM block 530 for performing most of the steps outlined in FIGS. 24–26. It should, however, be obvious to those of ordinary skill in the art that these steps may be performed by hardware means rather than by the microprocessor.

FIG. 27 shows an example of what the contents of a look-up table 1030 stored in the SPM RAM block 548 may maintain. Table 1030 is formed of an array of volatile storage locations (RAM) organized in LBA/PBA rows and columns. Each row is addressed by a nine-bit LBA value, LBA row address 1032, such as LBA 0, 1, 2, 3, . . . , n−1. The number of rows is a function of the memory capacity afforded by the memory unit 508. For example, a memory capacity within the nonvolatile memory unit 508 of at least 4 Mbytes can store 500 blocks (each block having 16 sectors and each sector being 512 bytes) therein and 500 blocks require 500 rows in the table 1030. The columns of table 1030 comprise of a nine-bit block address 1034, a 'defect' flag 1036, a 'used' flag 1038 and an 'old' flag 1040 for indicating the status of each block within the memory unit 508 (the reader is reminded that an LBA value is used to address a sector of information received from the host while a PBA, developed by the controller, is used to address a sector of information within a multi-sectored block that is stored in the memory unit 508).

For ease of understanding, the flow chart of FIGS. 24–27 is discussed with reference to the contents of table 1030, as shown in FIG. 27, as well as examples of the contents of table 1030, as shown in FIGS. 28–38.

In FIG. 24, step 1000 is shown to include a command sent from the host 502 to the controller 506 for writing a sector of information to the memory unit 508. The sector of information is addressed by the host and this host-provided address is transformed to an LBA value, i.e. LBA X, by the controller. As discussed hereinabove with respect to other embodiments of the present invention, the host interface block 520 receives the host command, including sector information and address, and develops LBA X therefrom for addressing an LBA/PBA row within the table 1030 in FIG. 27.

LBA X is developed from an address provided by the host that may be either in LBA format or CHS format, in which case it is transformed to an LBA format. The LBA address is 16 bits in the preferred embodiment but is four least significant bits (LSBs) are masked and the remaining 12 bits are shifted four times to the right, the nine LSB bits of the shifted value are used to address the LBA/PBA rows of table 1030 at 1032. Nine bits are used for the row addressing to address 500 blocks in the table 1030. Alternatively, if the memory unit 508 has a different capacity and other numbers of blocks are utilized, a corresponding bit-size is used as earlier described. Similarly, in alternative embodiments, a block may comprise of a different number of sectors. Consistent therewith, the number of bits being masked from the address received from the host will be different. For example, if a 32-sectored block size is employed, 5 bits would be masked from the address instead of the current 4 bits as performed by the system of the preferred embodiment. Furthermore, a sector of information is organized to include a user data portion that is 512 bytes and an overhead portion, the latter having at least an ECC field and may be further stored with flag and address information in the memory unit 508.

Referring back to FIG. 24, upon receipt of such a command by the host interface block 520 (of the controller 506), the microprocessor block 524 (also within the controller 506), in step 1002, compares the address of the sector being accessed, i.e. LBA X, to a PREV_LBA sector address, the latter having been previously stored in a storage location, such as a register (named moved LBA register 1054 in later figures), within the microprocessor block 524. If LBA X and PREV_LBA are equal, step 1004, the write command from the host is a sequential write command and the microprocessor block 524 checks as to whether the block that is addressed by LBA X has been written to previously by checking the VPBA, which is a nine-bit address of the block assigned to a corresponding LBA (as will be explained further) and the contents of the block address 1034 of SPM RAM block 548.

As an example, if LBA 5 was commanded to be written by the host, the four LSBs of the binary notation of the number '5' would be masked resulting in the value '0' and in FIG. 27, the VPBA block address 1034 corresponding to LBA 0, which in this case is set to '1FF' indicating the block is not yet used, would be checked. If the VPBA is valid, i.e. is a value other than all one's ('1FF' in Hex.), the microprocessor block 524 checks a move pending flag, which is a bit and when set indicates that information is stored by the microprocessor. The move pending flag may be optionally stored in the SPM RAM block 548, as shown in FIG. 27 at column 1042 instead of by the microprocessor. The decision as to where the pending move flag may be stored is a design choice although it should be noted that the pending move flag, whether stored in the microprocessor block or the SPM RAM, is only a one bit information. This is because there can only be one block that is in the process of being moved from one location in the nonvolatile memory unit 508 to another location therein and the move pending flag indicates whether or not such a block move is pending. It should be obvious to those of ordinary skill in the art that in alternative embodiments, more than one block may be pending a move. However, in such an implementation, the microprocessor must keep track of more LBAs and more hardware in needed. The determination as to whether to use one or more than one pending move blocks in a matter of design choice.

In the case where there is a pending block move, i.e. at least one sector of a block that has been re-written by the host prior to erasure thereof has been moved to another block within the memory unit 508. That is, in FIG. 24, after step 1006, step 1018 follows and LBA X sector information is written to the block housing the sectors being moved. Thereafter, in step 1020, the microprocessor increments LBA X by one and stores this incremented value in the PREV_LBA location.

Referring back to the top of FIG. 24, at step 1002, if LBA X does not match the PREV_LBA, the implication is that the address of the sector currently being accessed by the host does not sequentially follow the address of the sector previously accessed by the host. Accordingly, as shown at step 1022, in FIG. 25, the entire block of information where sectors were previously written are transferred to a new block location defined by the block location to which the old block is being moved. The following step is to perform an erase operation of all locations of a block that is located at an address corresponding to LBA X in the memory unit 508, step 1024, prior to its re-use. Thereafter, at step 1026, a move PBA register, which is a storage location for maintaining information regarding the location of the block that is in the process of being moved, is cleared as is the move pending flag and the process resumes from step 1004 in FIG. 24.

In FIG. 24, if the VPBA at 1034 that corresponds to LBA X is not valid (or not '1FF' as explained above), a search is conducted by the SPM control block 546 (in FIG. 10) for locating a free block in memory unit 508, as shown in FIG. 26 at step 1028. The 'used' flag corresponding to the PBA X location in the flash memory unit 508 is set, indicating that the LBA X block has been re-accessed prior to erasure thereof, as shown at step 1029. Later, at step 1031, the VPBA of the located free block is stored in one of the locations of the look-up-table 1030, this location being in one of the rows of column 1034 that corresponds to LBA X in FIG. 27. After step 1031 in FIG. 26, the process flows back to step 1016 of FIG. 24.

Similarly, in FIG. 24, if the VPBA at 1034 corresponding to LBA X is valid, then the move pending flag is checked at step 1006. If the move pending flag was not set at step 1006, a search is conducted for a free LBA block at step 1008, the pending move flag is set at step 1010, the VPBA of the newly-located free block (of step 1008) is stored in a location of the look-up-table 1030 at step 1012 and the 'used' flag corresponding to the LBA X block in the memory unit 508 is set.

At step 1016, the VPBA of the newly-located free block is stored in a move PBA register by the microprocessor. The move PBA register is shown as 1052 and the moved LBA register is shown as 1054 in FIG. 27. Both of these registers as well as the VPBA block address at 1034 are initialized to the hexadecimal value '1FF' after initial power-on of the digital system 500 as well as after erasure of the moved block. In fact, in the above discussion, with reference to the flow charts shown in FIGS. 24–26, wherever it is indicated that any of these registers is "cleared" (such as in step 1026), that is actually setting the contents of the registers to '1FF'.

After step 1016, data that was received by the host to be written to the LBA X block is written to the newly-located free block in memory unit 508, as shown at step 1018. LBA X is then incremented by one and the incremented value is stored in PREV_LBA at step 1020.

In the manner described above, the preferred embodiment of the present invention avoids having to move all of the sectors of a block, the sectors of which are being re-written prior to an erase operation, to an unused location in flash when sectors are singly and sequentially addressed by the host. This is because each time the next sequential sector is accessed, the block location where the most up-to-date, or moved, sectors reside is maintained in the move register PBA 1052 and since the PREV_LBA value maintains where within the latter block the next sector should be written, the write operation is performed using these two parameters without the necessity of having to move an entire block. This in turn saves many unnecessary read, write and erase operations as required by prior art systems. For example, in the prior art systems, when one sector of a block was re-written, 15 read operations and 15 write operations were necessarily performed because an entire block of information was moved. The present invention however, as will be further evident with the examples provided below, avoids these 15 read and write operations and only writes the sector being re-written.

FIG. 28 generally depicts the organization of information within the blocks of the memory unit 508. As shown, each block includes sixteen sectors and each sector of a block includes a 512-byte location 1056 for storing the user data portion of a sector and a storage location 1058 for storing the ECC. Each block, i.e. Block 0, Block 1, . . . is addressed using the 9-bit block address value of 1034 (in FIG. 27) and each sector within the block is addressed using the 4 masked LSB bits discussed above after they are unmasked. The last sector of each block further includes a block address location 1060 for storing the 9-bit LBA value for the block in which the block address location 1060 resides. For example, the block address location 1060 of block 0 will contain the value '0', the block address location 1060 of block 1 will contain the value '1', the block address location 1060 of block 2 will contain the value '2' and so forth for all blocks. In fact, these values are the same as the values of the LBA/PBA row address 1032 (shown in FIG. 27).

Further included in the last sector storage area of each block is storage location for maintaining the 'defect' flag 1062, the 'used' flag 1064, the 'old' flag 1066 and a 'good' block flag 1068. The defect and old flags 1062 and 1066, respectively, correspond to the defect and old flags 1036 and 1040 of the SPM RAM look-up-table 1030 (shown in FIG. 27). Each 'used' flag corresponds to one sector of a block, therefore, each sector location of each block maintains a 'used' flag location. The reason for having a 'used' flag for each sector in the block is to indicate which sectors of the block have been moved or are being written to the move PBA location (as indicated by the contents of move register PBA 1052) from the originally-maintained LBA location (as indicated by the moved LBA register 1054). This is especially useful during moving of an entire block having some sectors that have been moved and others that have not.

For example, when a sector that is non-sequential in order is accessed by the host, as noted above with reference to FIGS. 24–26, an entire sector that was in pending move status is moved. In such a case, the microprocessor checks the 'used' flag of each sector within the block being moved and only moves the sectors whose 'used' flags are not set because those sectors having 'used' flags that are set have already been moved during sequential accesses by the host.

In an alternative embodiment, rather than utilizing 'used' flags to indicate which sectors need be moved, a move locator location that is a word (16 bits) in length is utilized by the microprocessor and stored in the microprocessor block 524 to do the same. After the time when the pending move flag is set, every time a sector is moved to the move PBA location, a bit within the move locator word (shown as 170 in the example of FIG. 29 and on), corresponding to the location of the sector within the block is set. Therefore, the move locator word acts as a map to the moved sectors of a block and provides a fast way of identifying which sectors of the block pending move are in the move PBA location and which are in the moved LBA location.

The 'good' block flag 1068 is maintained in the first and last sectors of each block for purposes of identifying the location of the block that has the most recent and accurate copy of the stored file. After a power interruption, the contents of the memory unit 508 are used to update the look-up-table 1030 in the SPM RAM and when a block, for example, was in the midst of being moved from a first location within the nonvolatile memory unit 508 to a second location within the memory unit 508 prior to when the power interruption occurred, the block information is distributed among two blocks that will be addressed by the same LBA. The second block where information was being moved can not be relied upon for having good data since the move was not completed and the information in the first block may in fact be more useful.

When a block is being moved from a first block to a second block, the last sector of the first block is moved to the second block first and the 'good' block flag 1068 of the last sector of the second block is set to indicate that that block is 'good', thereafter the next to the last sector of the first block is moved to the corresponding location of the second block and so on until all of the sectors including the first sector of the first block are moved. Thereafter, the 'good' block flag of the first sector of the second block is set to indicate that the second block is 'good'. In this respect, if for example, upon the restoration of power, two blocks have the same LBA values due to the incomplete transfer of block information from one block to another, the block with the accurate information may be identified by checking the status of the two 'good' block flags of each block. That is, where a block has two unmatching 'good' block flag values, it was never completely transferred and therefore not a good block. If, on the other hand, one of the blocks has two matching 'good' block flags that indicate the block is good and the other block has two non-matching flags that indicate the block is not good and the pending move flag is set, then the microprocessor concludes that the latter block in not good and uses the information in the former block as valid information.

FIGS. 29–38 are provided to show several examples of the contents of the SPM RAM look-up-table when various types of LBA accesses for a better understanding of the operation of the preferred embodiments as discussed above relative to FIGS. 24–28. Initially, upon power-up of the system, the values in the block address locations 1034 and the move PBA register and moved LBA register contents are all set to '1FF' in Hex. The flags and the move locator word 170 are all set to '0'.

Figure 29:
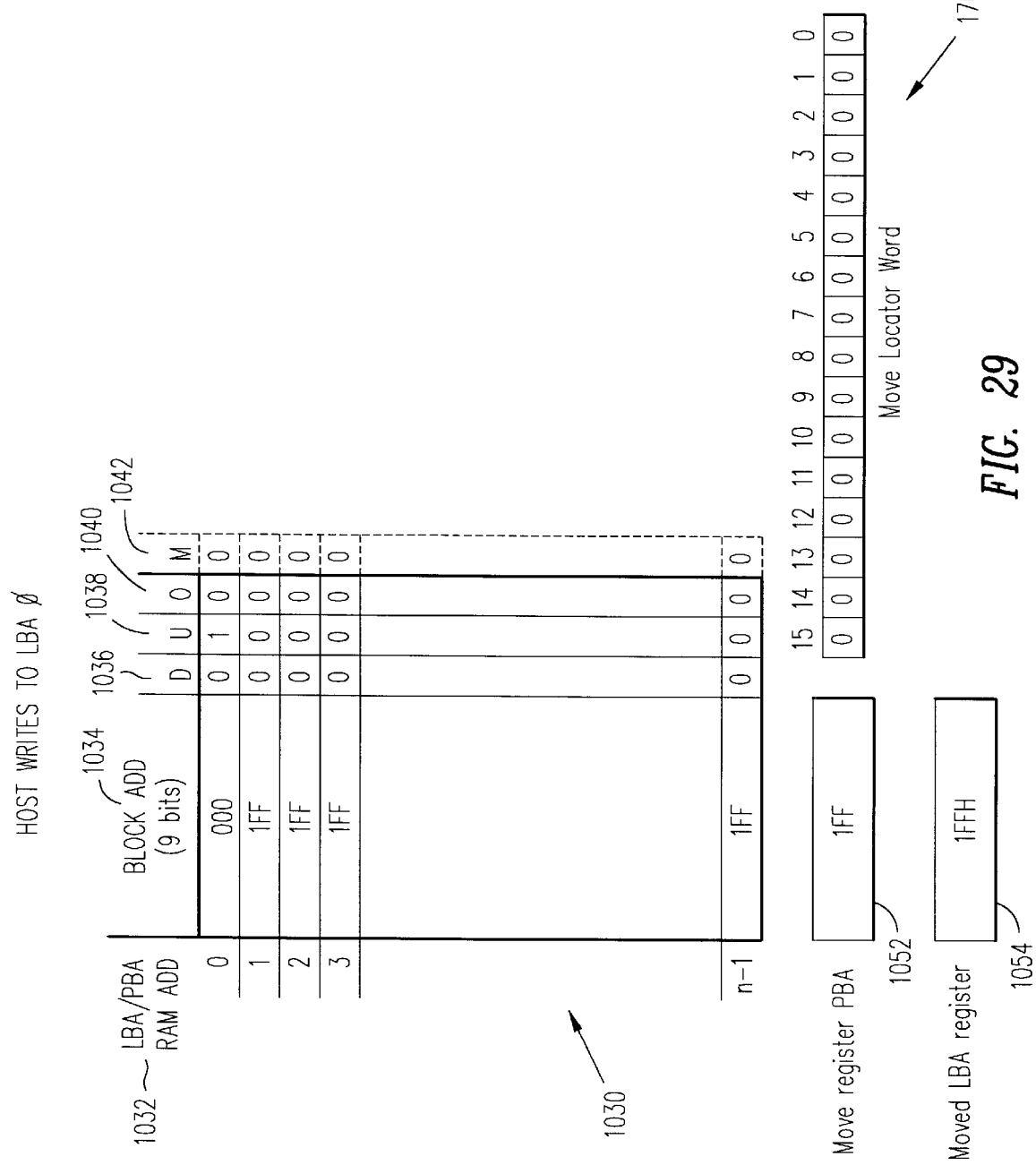

In FIG. 29, after power-up, if the host commands the controller to write to LBA 0 through LBA 15, the SPM controller is likely to find block 0 to be free and the microprocessor will use it to store the data provided by the host. Accordingly, the block address 1034 of the LBA block 0 will contain the value '0' and the 'used' flag for that block will be set.

Figure 30:
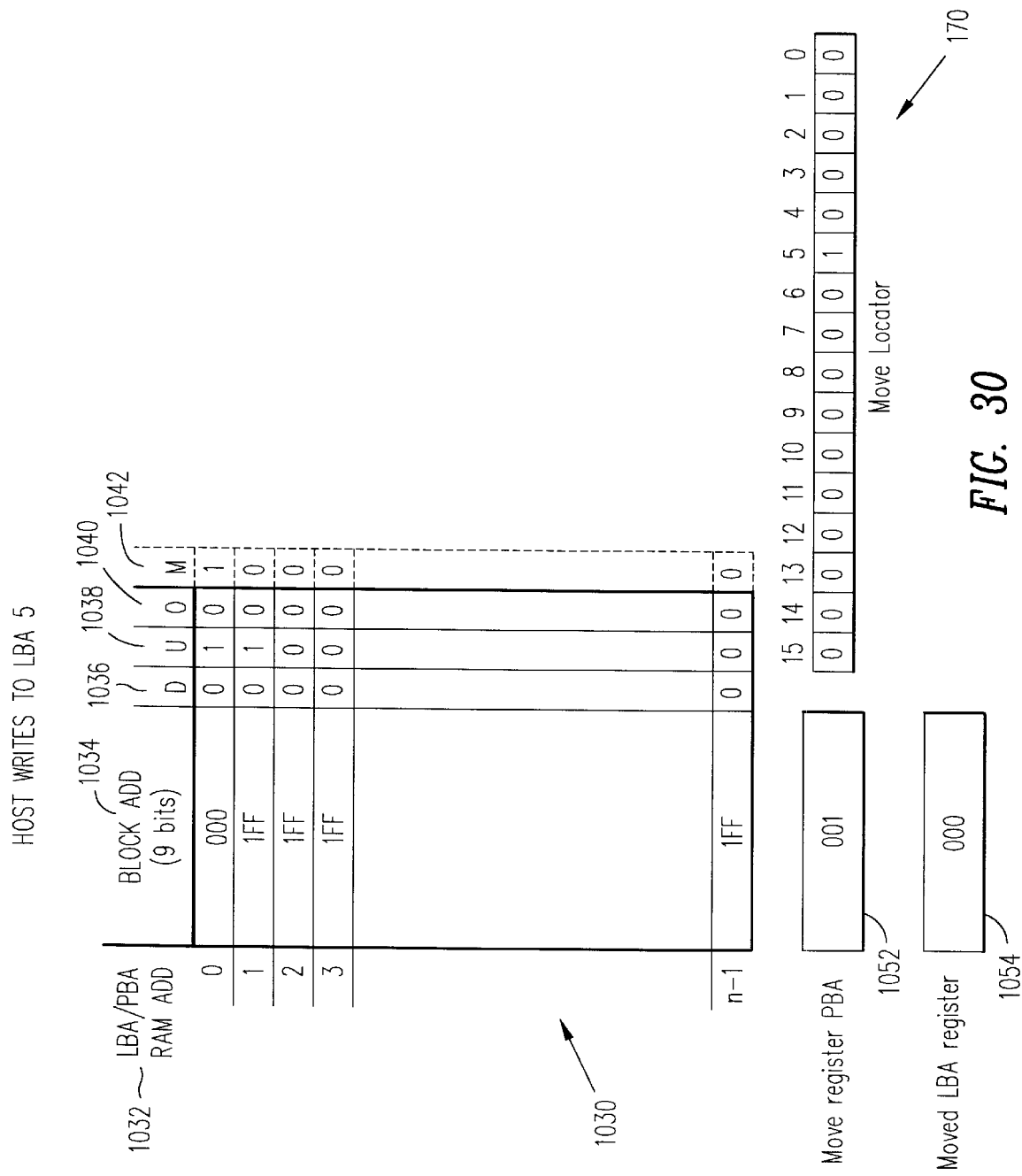

In FIG. 30, the host commands the controller to write only to LBA 5 after the write of FIG. 29. In this case, the hexadecimal notation of the value '5' is processed to mask its 4 LSBs thereby yielding the value '0'. But since the location LBA 0 within the memory unit 508 was written to in the steps of FIG. 29, the SPM controller must search for another available free block. Assuming such a block to be at address '1', the controller will then write the data that was sent by the host to be stored as LBA 5 to location 5 of LBA block 1, which is the sixth sector location (location 0 being the first sector) within block 1. Then, the move pending flag, which may be stored either in the microprocessor block or alternatively in the SPM RAM look-up-table at location 1042 will be set by the controller.

The controller further writes the address where the block is being moved to, '001', to the move PBA register 1052 and sets the move pending flag (either in the microprocessor or 1042. It should be noted that the move PBA register 1052 may be saved in the SPM RAM in alternative embodiments. The controller also sets the 'used' flag 1038 corresponding to Block 1 in the SPM RAM look-up-table 1030 and updates the moved LBA register 1054 to store a '0' value indicating that at least one or more sectors of block 0 have been moved elsewhere in the memory unit 508. If move locator word 170 is used, the controller also updates the same to indicate that LBA 5 has been moved.

Figure 31:
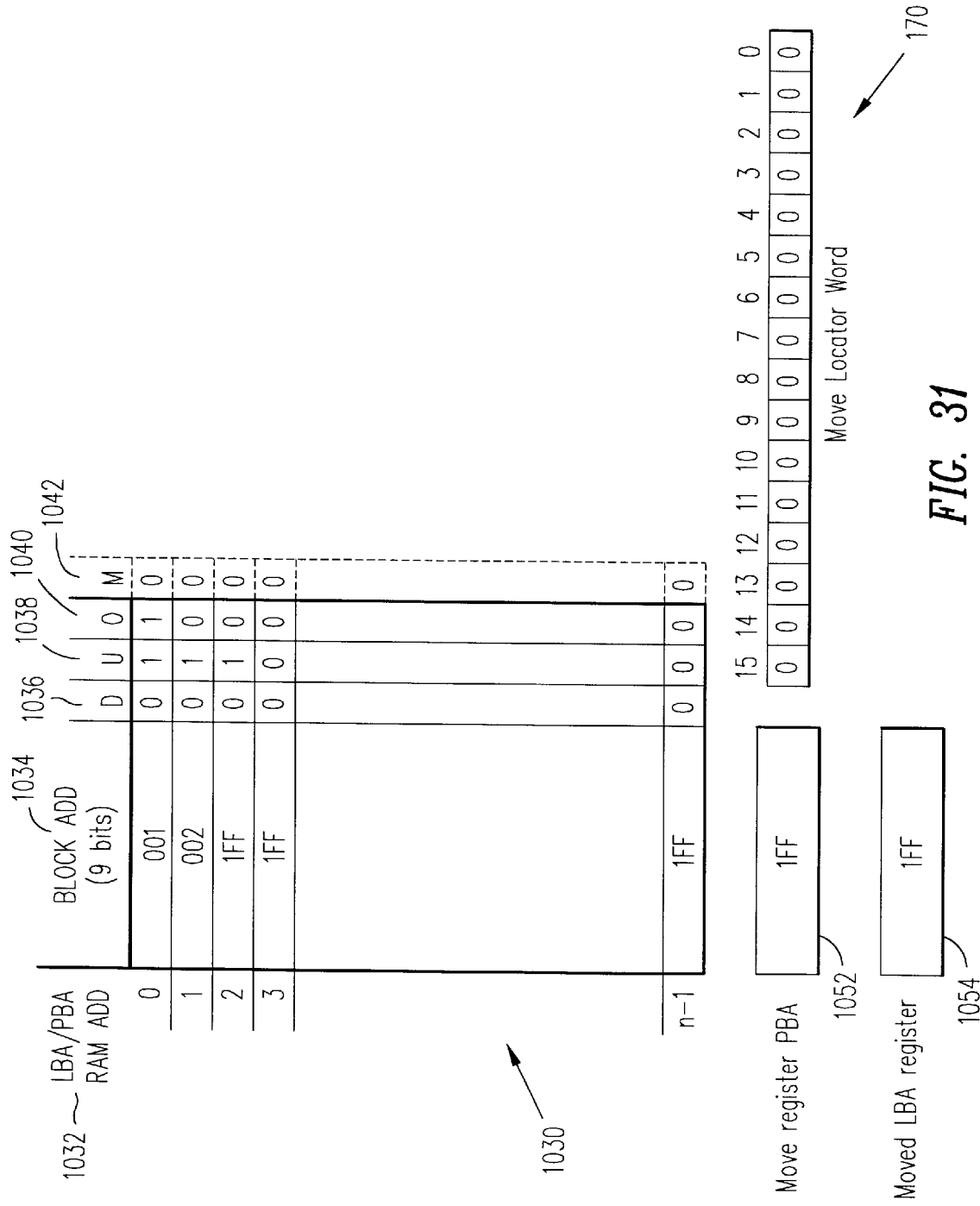
Figure 32:
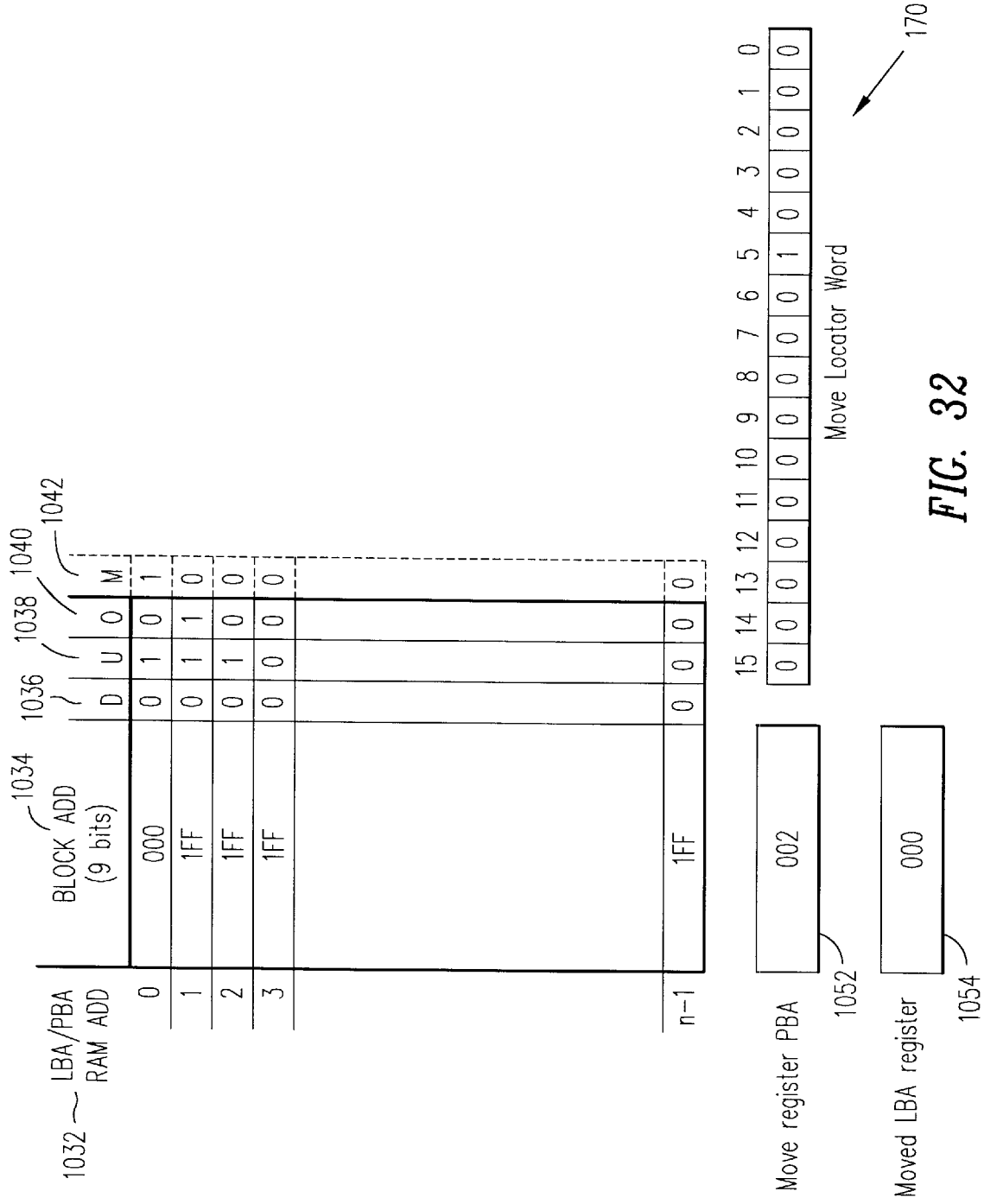
Figure 33:
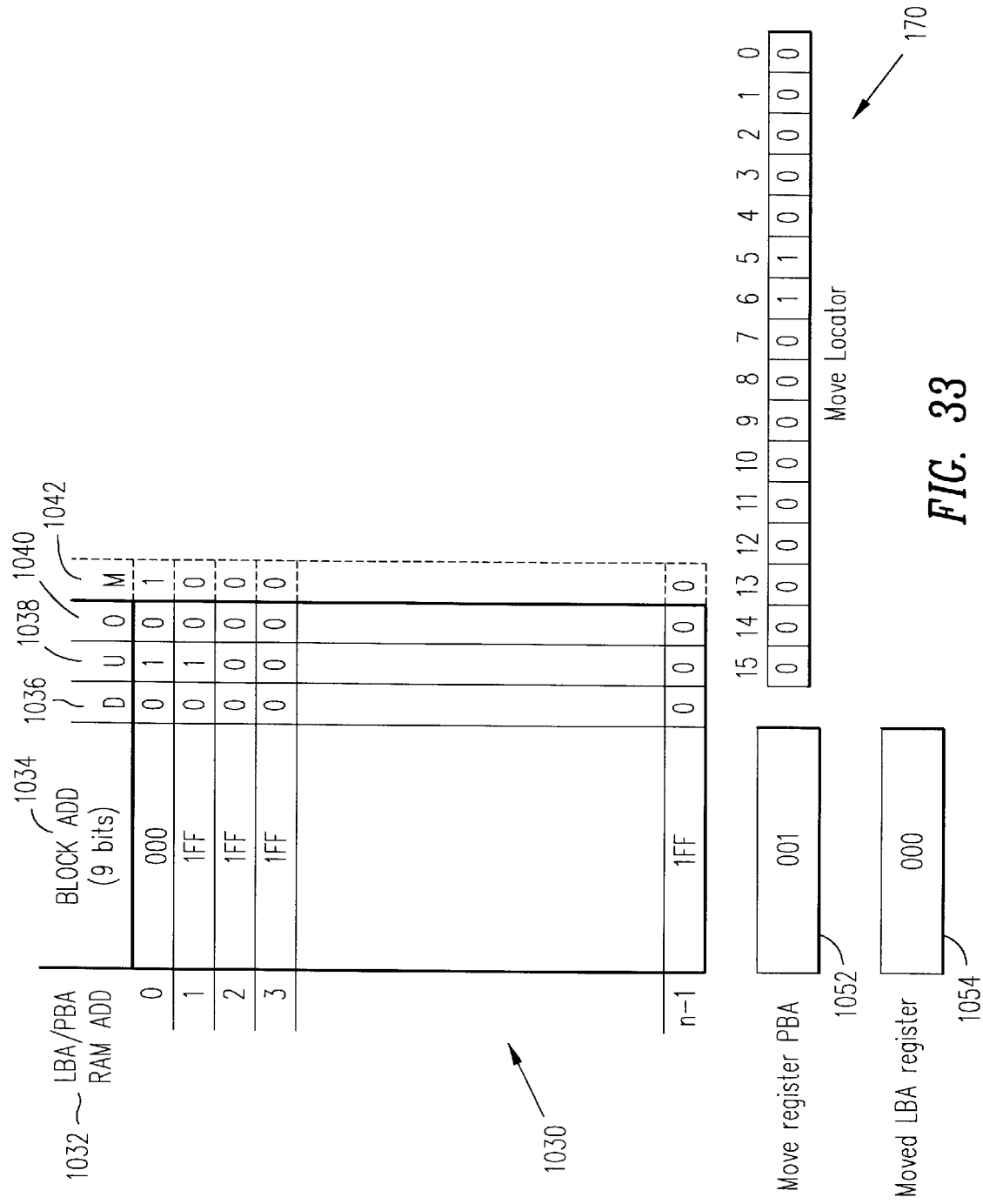
Figure 34:
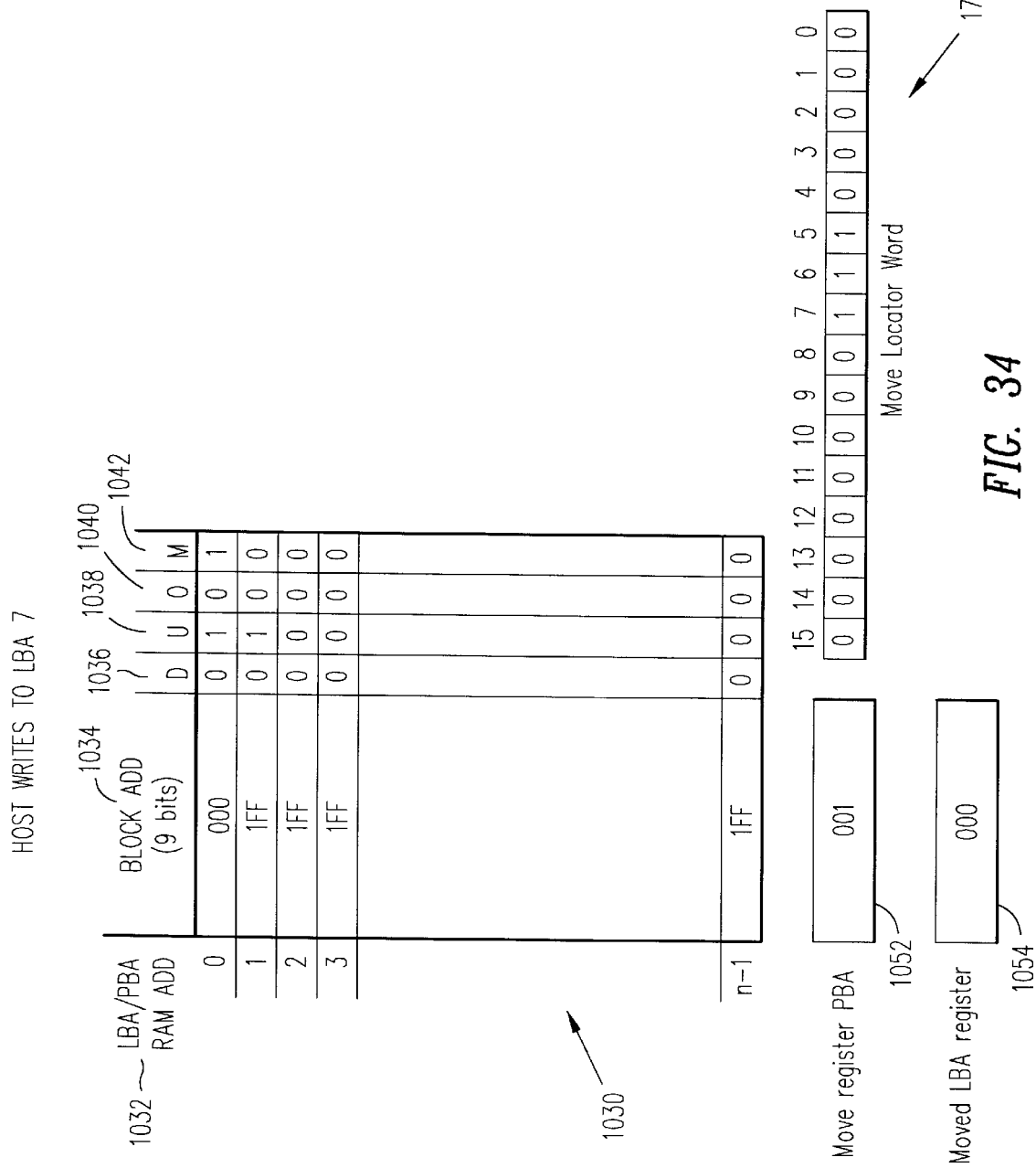
Figure 35:
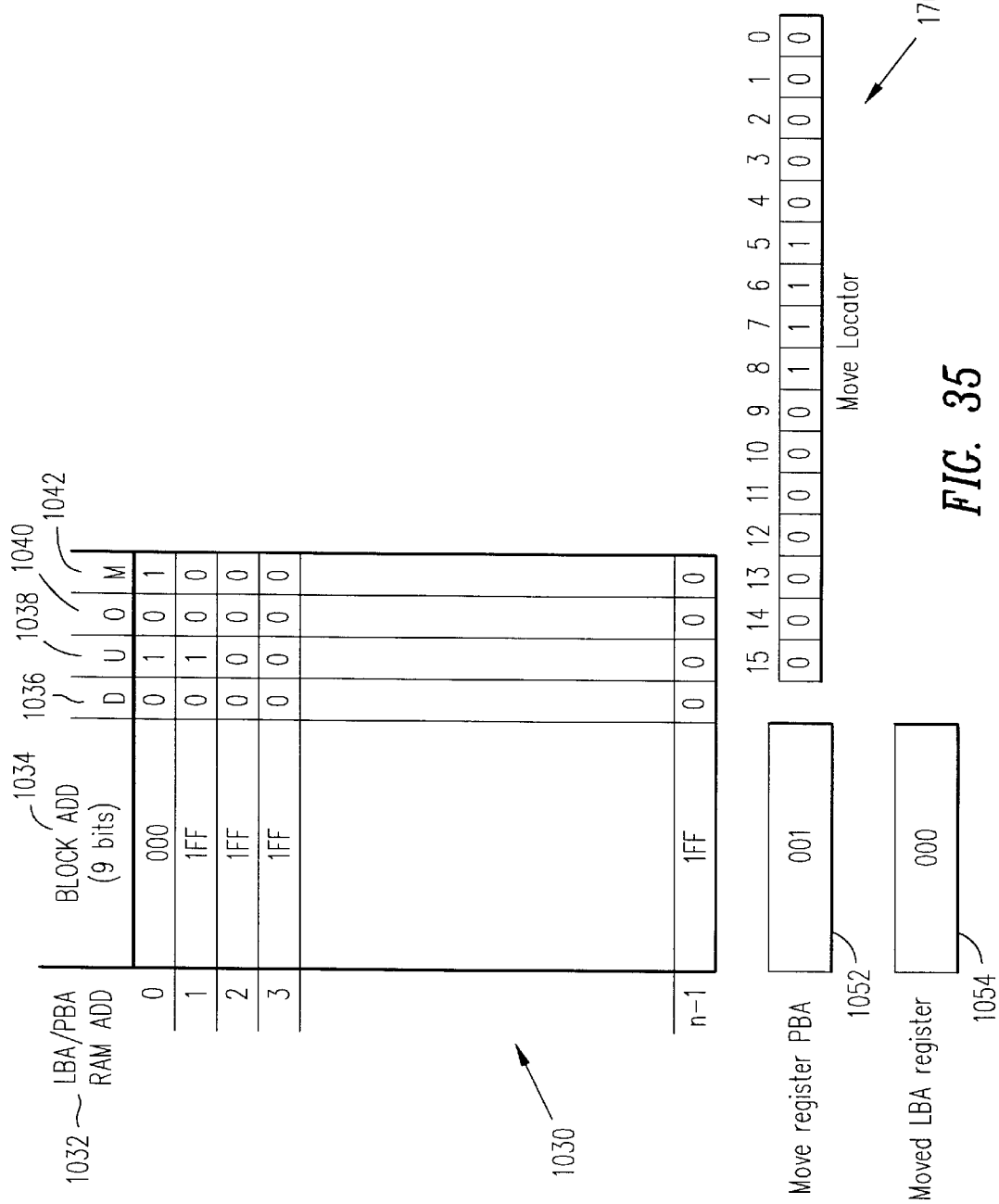
Figure 37:
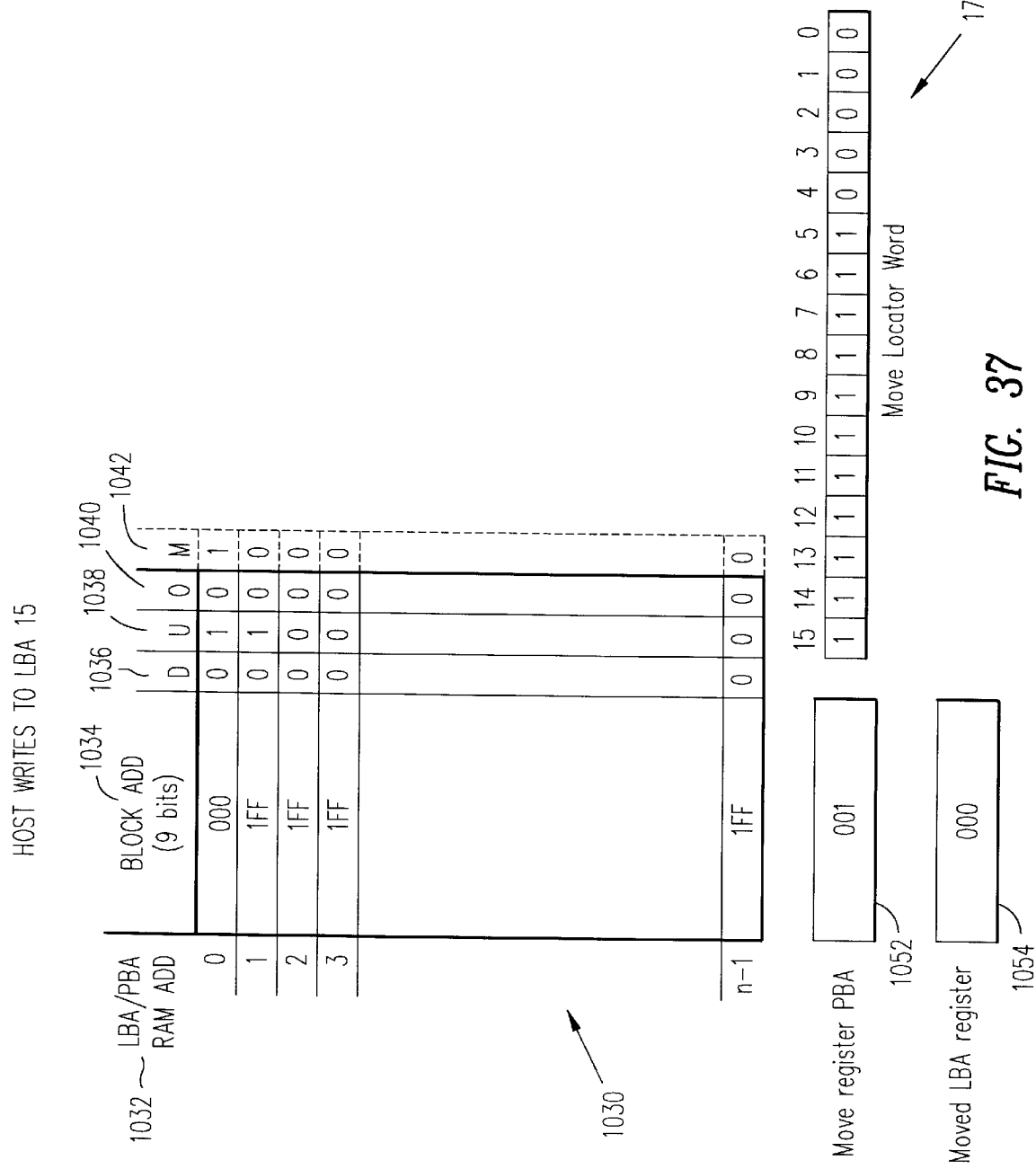

From hereon, several different events may occur and in each case, the contents of the look-up-table 1030 is clearly different. FIGS. 31–33 illustrate what the contents of the look-up-table 1030 may be after the state shown in FIG. 31 in order to demonstrate the effect of the various events. In particular, FIG. 31 depicts the contents of 1030 when an LBA which is not in block 0 is written, FIG. 32 depicts the contents of 1030 when the host writes to LBA 5 again and FIG. 33 depicts the contents of 1030 when the host writes to an LBA other than LBA 5 that is nevertheless within block 0, i.e. LBA 6.

In FIG. 31, if the host writes to LBA 17, this is clearly outside of block 0 and its a non-sequential sector write since the previous write was to LBA 5. Here again, the 4 LSBs of the hexadecimal equivalent of the value '17' is masked yielding block '1'. The controller then checks the moved LBA register 1054 against '1' and also checks as to whether the move pending flag is set. Since the value in the moved LBA register is '0', there is no match and the pending move must be closed. That is, all of the sectors that have not yet been updated in block 1 must be moved from block 0 to block 1 and block 0 must either be erased or marked as 'old' until some later point in time when it can be erased in the background prior to writing the new LBA 17 to a block in the memory unit 508. The new LBA 17 is thus written to block 2, which is the next free block found by the SPM controller.

FIG. 32 depicts the case where LBA 5 is again accessed by the host. In such a case, the data received from the host for LBA 5 must be written into another block and the move PBA register 1052 must be updated with the next block address and the old block must be marked as 'old' for erasure thereof. In this case, the LBA 5 is written to block 2 which is free and since there was no other sectors written in block 1 other than sector 5, no other sectors are moved from block 1 to block 2 and the contents of block 0 remains the same. Block 1 is marked as 'old' and the move PBA register 1052 is updated to include the value 002 since LBA 5 is now presiding in block 2. It is important to note that in this example, the need to move all of the sectors from block 0 to block 1 or block 2, as required by prior art techniques, is avoided thereby eliminating 15 read and 15 write cycles. The controller additionally sets the 'used' flag corresponding to block 2.

In FIG. 33, the host writes to LBA 6. Here the controller again masks the lower 4 bits of the Hex. equivalent of '6' resulting in '0'. The controller then checks this value '0' against the value in the moved LBA register 1054 and finds that a match exists between the two values. Either by way of checking the move locator word 170 or by checking the 'used' flag corresponding to sector 6 for determining whether sector 6 has been written to previously or whether it is free for use. In this case, since sector 6 was not previously written, the controller merely sets the corresponding bit of the move locator word 170 (or alternatively the used flag of sector 6 in the memory unit 508) and writes the data received from the host to sector 6 of block 1. No other modifications to the contents of the look-up-table 1030 is necessary.

If the host continues to write data into LBAs 7,8,9 through 15 sequentially, these new LBAs are accordingly written into sectors 7, 8, 9 through 15, respectively, by the controller. Once the end of the block is reached, that is, the last sector, sector 15, is written, sectors 0, 1,2,3, and 4 are moved from block 0 to block 1 because the host has not updated these sectors. Block 0 is then marked 'old' and the move PBA register 1053 and the moved LBA register 1054 are initialized to '1FF' indicating no pending moves. For the same reason, the move locator word 170 is also initialized to '0'. This discussion is depicted in the examples shown in FIGS. 34–38.

Figure 38:
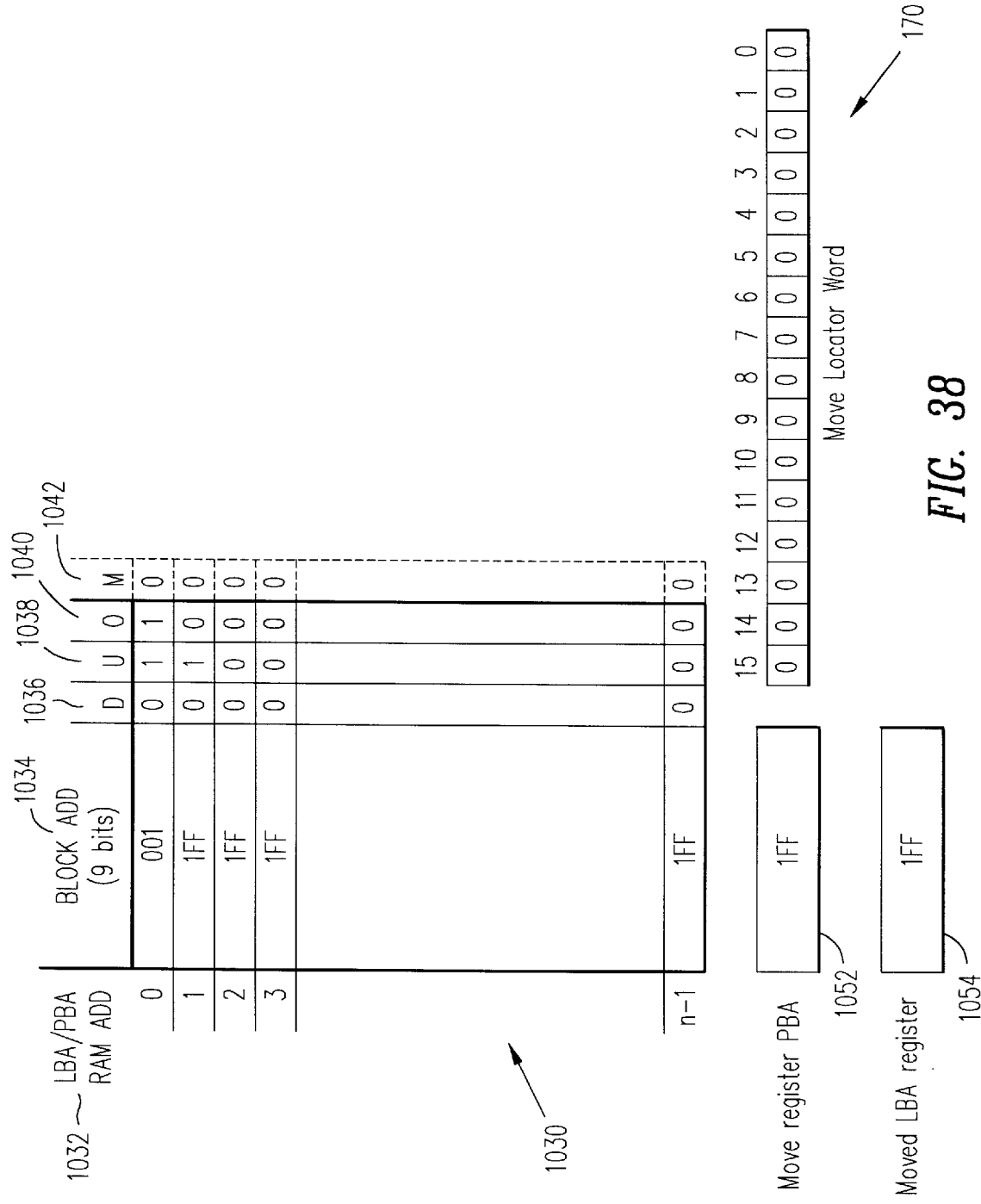

Referring to FIG. 38, the status of the look-up-table 1030 is shown when the block has been entirely exhausted and the pending move is closed. As shown, the block address 1034 of LBA block 0 is now '001' and block 0 is marked as 'old' for erasure thereof and registers 1052 and 1054 are shown to have been initialized.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method for updating sector information in a digital system having a host coupled through a controller to a nonvolatile memory device for storing digital information organized into sectors in the nonvolatile memory, each sector having a data portion and an overhead portion and being uniquely identifiable by the host using an LBA (Logical Block Address), the sector information stored within a sector location within the nonvolatile memory device, a group of sector locations defining a block addressable by the controller using a VPBA (Virtual Physical Block Address), and each sector location within a block being identifiable by the controller using a PBA (Physical Block Address), wherein the sector information stored in a sector location of a block within the nonvolatile memory device is updated prior to erasure of the block, the method comprising:

a. developing an LBA value corresponding to a host-addressed sector in response to a command received from the host to re-write sector information to a sector identified by the host;
   b. developing an LBA block address from the LBA value for addressing a block within the memory device within which the sector provided by the host is to be stored;
   c. comparing the LBA value with a previous LBA (PREV_LBA) value to determine whether or not there is a match;
   d. if the LBA value and PREV_LBA match, checking for a previous write operation to have been performed on the LBA block since the last erase operation of the LBA block;
   e. if a previous write operation has been performed, checking for whether or not any of the sectors of the block identified by the LBA block address have been transferred from one location within the memory device to another location within the memory device since the occurrence of the last erase operation on the LBA block;
   f. if the sectors of the block identified by the LBA block address have not been transferred, finding a free block within the nonvolatile memory device for storing the sector information, the free block being identified by a VPBA value corresponding to the LBA block;
   g. storing the sector information within a sector location of the free block corresponding to the sector location of the LBA block;
   h. storing the VPBA value in a PBA storage location for indicating the free block location within the memory device wherein the new sector information resides;
   i. incrementing the LBA value by one; and
   j. replacing the PREV_LBA value with the incremented LBA value, wherein single sequential write operations are performed on a sector of a block that was previously written and not yet erased without moving all other sectors of the block.

2. A method as recited in claim 1, wherein a move locator value is generated and stored in a particular storage location, and further including, after said step of storing the sector information, the step of modifying the value of a move locator storage location to indicate the status of which sector within the LBA block has been updated by setting a bit in said particular storage location, the position of the bit within the move locator value corresponding to the position of the updated sector within the LBA block.

3. A method as recited in claim 1, wherein the sector overhead portion includes a 'used' flag that when set indicates that the sector has been written to by the host since the last erase operation, and when not set indicates that the sector has not been written to by the host since the last erase operation.

4. A method as recited in claim 3, further comprising after the step of finding, the step of setting a 'used' flag of the sector identified by the LBA value.

5. A method as recited in claim 1, further comprising after the finding step, the step of setting a pending move flag for indicating that at least a portion of the block has been moved to another location within the memory device.

6. A method as recited in claim 1, further including, the step of storing the VPBA value associated with the LBA value in an LBA storage location to indicate the location of the block within the memory device wherein the sector information of all sectors addressed by the LBA reside.

7. A method as recited in claim 1, wherein if the comparing step yields no match between the LBA value and the PREV_LBA value, transferring sector information for all of the sectors of the block identified by the LBA value to the block location identified by the VPBA value stored in the PBA storage location.

8. A method as recited in claim 7, wherein the block identified by the LBA value is erased.

9. A method as recited in claim 8, further including clearing a move pending flag and a PBA storage location after said transferring step and performing steps d. through j.

10. A method as recited in claim 7, wherein the sector overhead portion of at least two of the sectors in each block stored in the memory device each include a bit for storing a 'good' block flag and during said transferring sector information, setting the 'good' block flag of the first sector after the transfer thereof and setting the 'good' block flag of the last sector after the transfer thereof.

11. A method as recited in claim 10, wherein after a power interruption, the state of the 'good' block flags of the VPBA block are compared and if they are not equal, the sector information within the LBA block is accessed instead of the VPBA block when the host addresses the LBA block.

12. A method as recited in claim 1, wherein if the previous write operation of step e has not been performed, finding a free block within the nonvolatile memory device for storing sector information, the free block identified by a VPBA value corresponding to the LBA block.

13. A method as recited in claims 3 or 12, wherein after said finding step, setting the 'used' flags of the sectors of the block identified by the LBA value and performing steps h. through j.

14. A digital system for use with a host for receiving commands therefrom and a nonvolatile memory device for storing digital information, the digital information being organized into sectors with each sector having a data portion and an overhead portion, and being stored in a sector location within the nonvolatile memory device, a group of said sector locations defining a block addressable by the controller using a VPBA (Variable Physical Block Address) value, and each sector location within a block being identified by the controller using a PBA (Physical Block Address) value, the digital system comprising:

a controller including,
  a. a host interface means responsive to a write command from the host for re-writing sector information to a sector identified by a sector address and operative to generate an LBA (Logical Block Address) value corresponding to the host-addressed sector and further operative to generate an LBA block address from the LBA value for addressing a block within the memory device for storing the sector information;
  b. means for comparing the LBA value with a PREV__LBA value;
  c. means for checking for a previous write operation to have been performed on the LBA block since the last erase operation of the LBA block;
  d. means for detecting whether or not any of the sectors of the block identified by the LBA block address have been transferred from one location within the memory device to another location within the memory device since the occurrence of the last erase operation on the LBA block, means for searching for a free block within the nonvolatile memory device for storing the sector information, the free block identified by a VPBA value corresponding to the LBA block;
  e. means for storing the sector information within a sector location of the VPBA block corresponding to the sector location of the LBA block;
  f. means for storing the VPBA value in a PBA storage location for indicating the block location within the memory device wherein the new sector information resides;
  g. means for incrementing the LBA by one, and means for replacing the PREV__LBA value with the incremented LBA value, wherein single sequential write operations are performed on a sector of a block that was previously written and not yet erased without the need for moving all other sectors of the block.

* * * * *